United States Patent
Sakai et al.

(10) Patent No.: US 6,246,274 B1
(45) Date of Patent: *Jun. 12, 2001

(54) SEMICONDUCTOR DEVICE CAPABLE OF TRIMMING MINIMUM DELAY TIME AND MAXIMUM DELAY TIME OF AN OUTPUT SIGNAL

(75) Inventors: Toshichika Sakai; Takaharu Fujii; Yasuo Yashiba, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/267,196

(22) Filed: Mar. 12, 1999

(30) Foreign Application Priority Data

Mar. 12, 1998 (JP) .................................................. 10-061303

(51) Int. Cl.[7] .................................................... H03H 11/26
(52) U.S. Cl. ......................... 327/270; 327/271; 327/273; 327/276
(58) Field of Search .................................... 327/270, 271, 327/272, 273, 276, 277, 279, 261, 263, 269, 166, 176

(56) References Cited

U.S. PATENT DOCUMENTS

| 4,626,716 | * | 12/1986 | Miki ...................................... 327/271 |
| 4,637,018 | * | 1/1987 | Flora et al. ............................ 327/152 |
| 5,022,056 | * | 6/1991 | Henderson et al. ................... 375/119 |
| 5,245,231 | * | 9/1993 | Kocis et al. ............................ 327/277 |
| 5,428,309 |   | 6/1995 | Yamauchi et al. ..................... 327/158 |
| 5,459,422 | * | 10/1995 | Behrin ................................... 327/276 |
| 5,570,294 | * | 10/1996 | McMinn et al. ....................... 327/277 |
| 5,818,890 | * | 10/1998 | Ford et al. ............................. 327/277 |

FOREIGN PATENT DOCUMENTS

| 61-261918 | 11/1986 | (JP) . |
| 2-296410 | 12/1990 | (JP) . |
| 9-181580 | 7/1997 | (JP) . |

\* cited by examiner

*Primary Examiner*—Timothy P. Callahan
*Assistant Examiner*—An T. Luu
(74) *Attorney, Agent, or Firm*—Foley & Lardner

(57) ABSTRACT

In a semiconductor device capable of obtaining an optimum delay time, a plurality of delay circuits are connected in series to one another through points of connections between two adjacent ones of the delay circuits to produce a plurality of reference delay signals derived from the delay circuits. One of the reference delay signals is decided as the optimum delay time with reference to a practical condition. Thus, the delay time can be varied in the semiconductor device.

22 Claims, 8 Drawing Sheets

SEMICONDUCTOR DEVICE CAPABLE OF TRIMMING MINIMUM DELAY TIME AND MAXIMUM DELAY TIME OF AN OUTPUT SIGNAL

BACKGROUND OF THE INVENTION

1. Field of the Invention

This invention relates to a semiconductor device and, in particular, to a semiconductor device which is capable of trimming timing of an output signal.

2. Description of the Related Art

It is a recent trend that a clock rate of an MPU (Micro-Processing Unit) or logic circuits connected thereto have been increased year by year. Recent requirements have been directed to a circuit operated at 100 to 300 MHz. In this case, a clock must be generated which has a clock period of 3 to 10 ns and the MPU generates each signal on the basis of this clock. Moreover, it would be expected that the clock rate will become higher in the future.

Here, when a signal passes through a logic gate, a transmission speed of the signal, namely, a delay time, is based on various variations. Such variations appear in dependency upon a manufacturing process of a transistor included in the logic gate (namely, a variation of a threshold voltage Vt or a gate length which determine performance of the transistor), driving ability, a parasitic capacity connected to a load, an operating temperature, or an operating voltage. At any rate, the variation of the delay time does not always fall within a predetermined range. When the delay time is fluctuated, a semiconductor device can not correctly operate because data is not correctly latched or a result of logical operation becomes incorrect.

On the other hand, it is requested that timing of a signal from a semiconductor device must fall within a predetermined range which is determined in relation to a peripheral device connected to the semiconductor device. That is, to guarantee operations between the semiconductor devices (devices on a board), a signal which sent from a semiconductor device to another semiconductor device lasts for a duration during which the signal can be certainly received by the other semiconductor device. In addition, a minimum delay time and a maximum delay time should be satisfied in connection with a reference signal.

If the signal does not satisfy conditions related to the delay times mentioned above and a change in the signal output from the semiconductor device is earlier than the reference signal, the other semiconductor device which must receive the signal can not fetch the signal and, as a result, receives the next following signal instead of the signal in question. On the other hand, if a change in the signal output from the semiconductor device is later than the reference signal, the other semiconductor device can not fetch or receive the signal but might wrongly receive a previous signal preceding the signal in question.

Under the circumstances, verification of each semiconductor should be made before shipment by a manufacturer about whether or not timing of output signal falls within the predetermined duration. Occurrence of a lot of defective products is undesirable because it leads to high cost of the semiconductor device. In particular, since a recent increase of the clock rate overwhelms an amount of a reduction rate of a variation in the manufacturing process, it is very difficult to establish the predetermined minimum and maximum output delay times.

Taking the above into consideration, even if any fluctuation takes place during a manufacturing process, it is important to design a semiconductor device so that the delay time of the semiconductor may fall within the predetermined range. For example, when a semiconductor device is operated by the clock of 10 MHz, no problem takes place even if fluctuation of 10 ns occurs in the clock. This is because a clock period is equal to 100 ns.

On the other hand, when the clock of 100 MHz is used for the semiconductor device, fluctuation of the delay time of 10 ns causes an undesirable operation to occur since the delay time becomes equal to the clock period of 10 ns.

To resolve the problem, disclosure is made, for example, in Japanese Laid-Open Publication No. H9-181580 (namely, 181580/1997) about a semiconductor which controls a delay time by improving a configuration of a circuit. In this event, a delay circuit which has a plurality of delay gates connected in series is incorporated in a semiconductor device and, in front of each delay gate, an AND gate which switches according to a control signal is provided. With this structure, a selected one of the delay gates is supplied to an external circuit by measuring a delay value required when the delay circuit is incorporated in the system, and the AND gate is closed to block passage of a pulse when an unused delay gate is sought and detected.

However, the delay circuit must have an expensive tester for measuring the delay value since the delay value must be measured by connecting the tester to the outside of the semiconductor device. In addition, the register in the semiconductor device must be set to adjust the delay time based on the measurement. In particular, when there is need to measure a delay time of the semiconductor device which operates at a high-speed, use should be made of a very expensive tester.

Moreover, when verification is performed before shipment, shipment processes become complicated due to addition of such a verification process and, as a result, a working time becomes long. This results in an increase of a cost of the goods.

Also a verification result obtained in a verification environment is not always identical with a result obtained in a practical use, because a practical temperature and a source voltage in practical use are often different from those of the verification environment.

In a usual verification process, the verification is performed by changing only a source voltage at a normal temperature to reduce a time of the verification. When the verification is performed by changing temperatures from one to another, it is practically impossible to verify or check all the products since the products must be taken in and out of a thermostatic chamber or the products must be held in the thermostatic chamber until they reach to a predetermined stable temperature.

No guarantee with a low temperature and a low voltage or with a high temperature and a high voltage is not given to the products, even if a delay time is measured and determined in the environment of a high temperature and a high voltage. Consequently, the delay time must be determined within a narrow range, which brings about a reduction of yields of the products.

On the contrary, if a valuation basis of the product is relieved so as to improve the yield, for example, by narrowing a usable temperature range and a usable source voltage range or by widening an acceptable delay time, restriction is required about applications and a usable environment of the semiconductor device.

Further, let set values of a semiconductor device be changed by measuring a delay time after the semiconductor device is assembled into a device in a conventional manner, a probe of a tester can not be connected to some of the semiconductor devices or an error is caused to occur in the delay time due to a parasitic capacity of the probe.

SUMMARY OF THE INVENTION

Therefore, it is an object of the invention to provide a semiconductor device which can set an optimum delay value in consideration of a practical environment without measuring the delay value by using an expensive tester.

To achieve the above object, a semiconductor device, for use in determining a delay time, according to the invention comprises a plurality of delay circuits connected in series to one another through points of connections between two adjacent ones of the delay circuits, selecting means for selecting one of a plurality of reference delay signals each of which is supplied from the point of the connections between two adjacent ones of the delay circuits, and deciding means for selectively deciding the delay time on the basis of the selected one of the reference delay signals.

Further, according to the invention, a semiconductor device, for use in changing a delay time by selecting one of a plurality of reference delay signals which are generated from points of connections of a plurality of delay circuits connected in series to one another, comprises reference pulse generating means for generating signals at first timing and second timing, with a time interval which is left between the first and the second timing signals and which is equal to a predetermined delay time, delay comparing means for comparing, with the second timing, the plurality of the reference delay signals produced by allowing the signal generated at the first timing to pass through the delay circuits, to obtain results of comparison, delay setting means for selecting one of the reference delay signals on the basis of the results of comparison in the delay comparison means to determine the delay time with reference to the selected one of the reference delay signals.

Further, according to the invention, a semiconductor device, for use in changing a delay time by selecting one of a plurality of reference delay signals each of which is supplied from a connection point of delay circuits which are connected in series to one another, comprises reference pulse generating means for generating signals at first timing and second timing, with an interval left between the first timing and the second timing by a predetermined delay time, delay determining means for supplying a signal which is generated based on the first timing to the delay circuit to compare an output of the delay circuits with the second timing, and delay setting means for selecting one of the plurality of the reference delay signals which passes through the delay circuits on the basis of the delay determining result to produce the selected signal.

Further, according to the invention, a semiconductor device, for use in selecting a delay time and in which a plurality of delay circuits are incorporated beforehand, comprises delay generation means for detecting delay times of the reference delay signals before and after the reference delay signals generated based on a reference pulse signal passes through each of the delay circuits, to produce one of the reference delay signals based on the detection result.

DESCRIPTION OF THE PREFERRED EMBODIMENT

[First embodiment of the invention]

Hereinafter, descriptions about a first embodiment of the invention will be made with reference to accompanying drawings.

Figure 1:
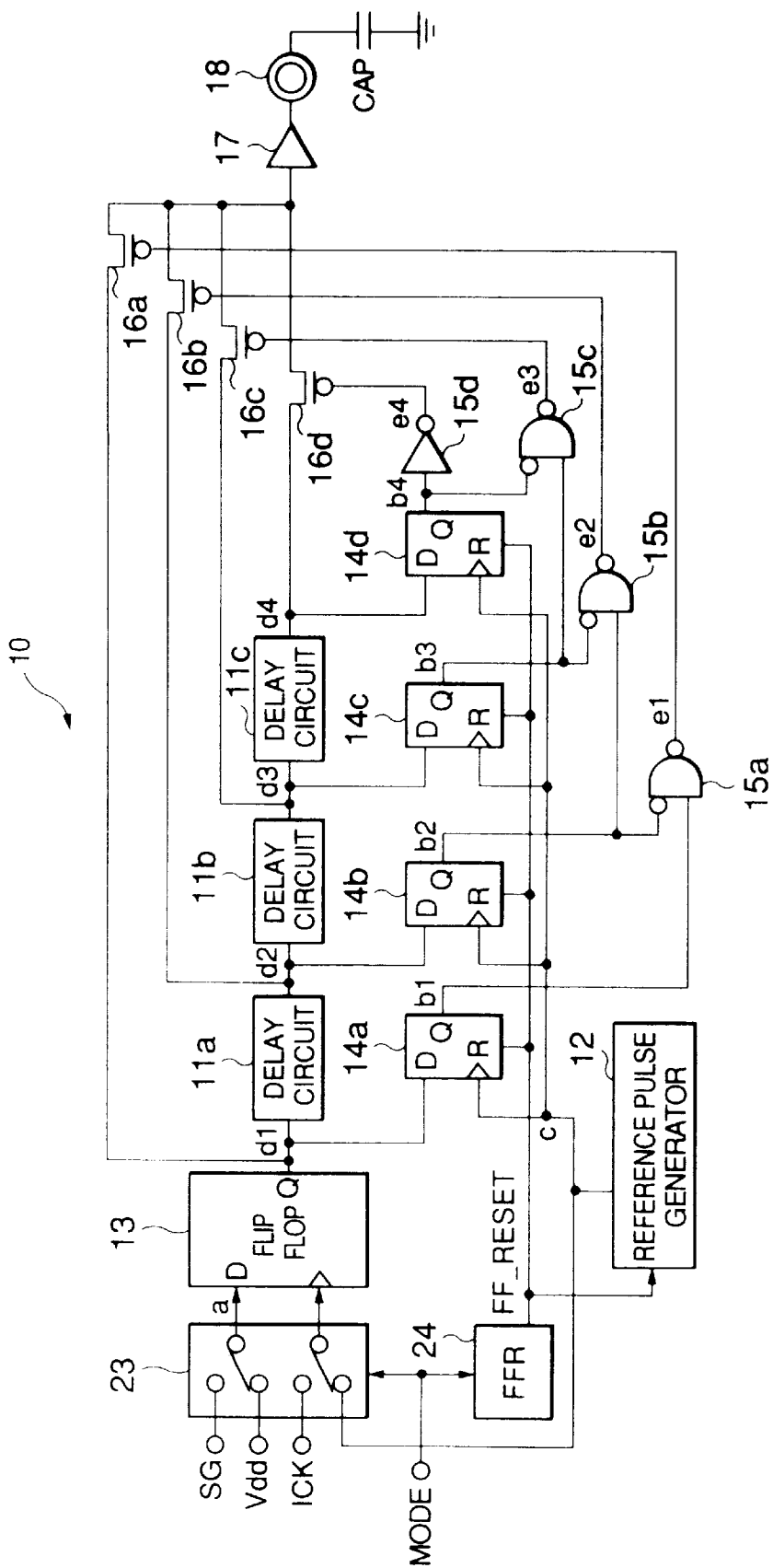
FIG. 1 shows a block diagram of a delay generation circuit of a semiconductor device according to a first embodiment of the invention.

FIG. 1 shows a block diagram of a delay generation circuit of a semiconductor device according to the first embodiment of the invention. In the embodiment, a signal from an internal circuit is controlled so that it falls within a predetermined delay time (hereinafter, referred to as a spec delay time T) compared to a standard signal.

As shown in FIG. 1, the delay generation circuit 10 supplied to the semiconductor device includes three delay circuits, which are incorporated beforehand, 11a, 11b, and 11c, a reference pulse generator 12, a flip flop 13, four registers 14a, 14b, 14c, and 14d, four selectors 15a, 15b, 15c, and 15d, four setting switches 16a, 16b, 16c, and 16d, a mode changeover switch 23, and a flip flop reset generator (FFR) 24.

The delay generation circuit 10 in the embodiment is operable in two modes, that is, a normal operation mode and a setup operation mode. In the setup operation mode, a delay circuit 11 is set and gives a predetermined delay time when an MPU is reset, or the MPU outputs a setup command. In the normal operation mode, a signal from an internal circuit is supplied as an output signal via the delay circuit 11 which is set and which gives a desired delay time after both a reset duration of the MPU and the setup operation duration are finished.

The delay generation circuit 10 has an input terminal supplied with a mode signal MODE which takes either one of first and second logical levels. The mode signal MODE is delivered to the mode changeover switch 23 and the FF reset generator 24. Here, the delay generation circuit 10 performs the setup operation when the mode signal MODE has the second logical level (hereinafter, denoted by a value "0"), and performs the normal operation when the mode signal MODE has the first logical level (hereinafter, denoted by a value "1").

The flip flop reset generator 24 produces a flip flop reset signal FFRESET of "0" for the predetermined duration when the mode signal MODE takes the second logical level of "0". Herein, it is to be noted that the mode signal MODE is changed to "1" after the duration of "0" lasts for several tens of ms while the flip flop reset signal FFRESET is changed to "1" after the duration of "0" lasts for several ns.

The three delay circuits 11a, 11b, and 11c are connected in series to one another. Each of delay times is successively added by the delay circuits 11a, 11b, and 11c. In the setup operation, a reference pulse supplied from the reference pulse generator 12 is given to an input terminal of the delay circuit 11a and timing of pulses sent from each of the delay circuit 11a, 11b, and 11c is checked. In the normal operation, a signal from an internal circuit (not shown) is supplied to the input terminal of the delay circuit 11a. Either one of the above-mentioned signal or each output signal of the delay circuits 11a, 11b, and 11c is selectively supplied to an external circuit.

The reference pulse generator 12 produces a reference pulse signal c, for example, for the reset duration. A pulse width of the reference pulse signal c corresponds to the maximum delay time to be delayed in the delay circuit 11.

Each of the four registers 14a, 14b, 14c, and 14d is structured by a flip flop. The four registers 14a, 14b, 14c, and 14d are operable to store reference delay signals d1 to d4 in synchronism with a falling edge of the reference pulse signal c. Herein, the reference delay signal d1 appears prior to the delay circuit 11a while the reference delay signals d2 to d4 are produced after the delay circuits 11a, 11b, and 11c, respectively. The reference delay signals d1, d2, d3, and d4, which are supplied to the registers 14a, 14b, 14c, and 14d, respectively, are delayed by delay times Ta, Tb, Tc, and Td in comparison with a rising edge of the reference pulse signal c, respectively. Each of the registers 14a through 14d compares each reference delay signal d1 to d4 with the rising edge of the reference pulse signal c to judge whether or not the corresponding delay times Ta through Td fall within predetermined values and to produce detection signals b1 through b4.

Among the four selectors 15a to 15d, each of the three selectors 15a, 15b, and 15c is formed by a NAND gate while the selector 15d is formed by an inverter. Using the detection signals b1, b2, b3, and b4 stored in the register 14a, 14b, 14c, and 14d, respectively, the selectors 15a to 15d select either signals which appear before passing through the delay circuit 11a, or which appear after passing through the delay circuit 11a, 11b, or 11c. Responsive to the selected signals, one of the four setting switches 16a, 16b, 16c, and 16d is turned on while the other switches are turned off. The setting switches 16a to 16d include a p-MOS transistor and are turned off in response to the first logic level "1" and turned on in response to the second logic level "0".

The selectors 15a, 15b, 15c, and 15d can detect the reference delay signals and serve to select one of the reference delay signals that satisfies a spec and which is the closest to the spec delay signal by detecting timing of transition of the detection b1 to b4 from "1" to "0". As a result, a delay time which satisfies the spec can be set by turning on the one of the setting switches based on the detection result.

The mode changeover switch 23 serves to selectively supply a signal to the flip flop 13 in normal operation mode or setup operation mode. The illustrated mode changeover switch 23 has two sets of changeover switches. A first changeover switch connects a data input terminal of the flip flop 13 to an output terminal SG of an internal circuit (not shown) when the normal operation mode, and to a power source voltage Vdd when the setup operation mode. Here, the power source voltage Vdd is kept at the first logic level "1". A second changeover switch connects a clock input terminal to an output ICK of an internal circuit (not shown) when the normal operation mode, and to an output c of the reference pulse generator 12 when the setup operation mode.

The flip flop 13, which is synchronized with a rising edge of an internal clock ICK which is supplied to the clock terminal, holds the output signal SG of the internal circuit (not shown) in the normal operation mode. On the other hand, in the setup operation mode, the flip flop 13, which is synchronized with a rising edge of the reference pulse signal c, holds a level of the power source voltage Vdd and outputs the reference delay signal d1 which has a delay time Ta and which is supplied from the output terminal of the flip flop 13. This reference delay signal d1 is then delivered to the delay circuit 11a, the register 14a, and the setting switch 16a. The delay circuit 11a further delays the received reference delay signal d1 by the delay time Tb, and outputs the reference delay signal d2 which has a delay time (Ta+Tb). This reference delay signal d2 is delivered to the delay circuit 11b, the register 14b, and setting switch 16b.

Similarly, the reference delay signal d3 which has a delay time (Ta+Tb+Tc) and is delivered from the delay circuit 11b to the delay circuit 11c, the register 14c, and setting switch 16c. Also, the reference delay signal d4 which has a delay time (Ta+Tb+Tc+Td) and is supplied from the delay circuit 11c is delivered to the delay circuit 11d, the register 14d, and setting switch 16d.

The register 14a is put into an initial state by a reset signal (FFRESET) to hold the delay signal d1 at the falling edge of the reference pulse signal c and to output the detection signal b1. Similarly, the register 14b is initialized by the reset signal (FFRESET) to hold the delay signal d2 at the falling edge of the reference pulse signal c and to output the detection signal b2. The register 14c is initialized by a reset signal (FFRESET) to hold the delay signal d3 at the falling edge of the reference pulse signal c and to output the detection signal b3. The register 14d is initialized by a reset signal (FFRESET), holds the delay signal d4 at the falling edge of the reference pulse signal c, and outputs the detection signal b4.

The selector 15a performs NAND operation between the detection signal b1 and an invert of the detection signal b2 to outputs a selection signal e1. Similarly, the selector 15b performs NAND operation between the detection signal b2 and an inverted detection signal b3 to output selection signal e2. Also, the selector 15c performs NAND operation between the detection signal b3 and an inverted detection signal b4 to output selection signal e3. The selector 15d inverts the detection signal b4 to output selection signal e4.

The setting switch 16a has a gate supplied with the selection signal e1 and controls whether or not the reference delay signal d1 is produced. Similarly, the setting switch 16b has a gate given the selection signal e2 and controls whether or not the reference delay signal d2 is produced. Likewise, the setting switch 16c controls production of the reference delay signal d3 in response to the selection signal e3 given to a gate. The setting switch 16d also controls production of the selection signal e4 in response to the reference delay signal d4 given to a gate.

In the setup operation mode, one of the setting switches 16a, 16b, 16c, and 16d is selected based on the selection signal e1 to e4 and one of the reference delay signal d1, d2, d3, and d4 is supplied to an inverter 17. In the normal operation mode, the signal SG of the internal circuit is supplied to the inverter 17 through one of the setting switches 16a, 16b, 16c, and 16d, and an output of the switch is supplied as an output delay signal outwards through an output terminal 18.

Figure 2:
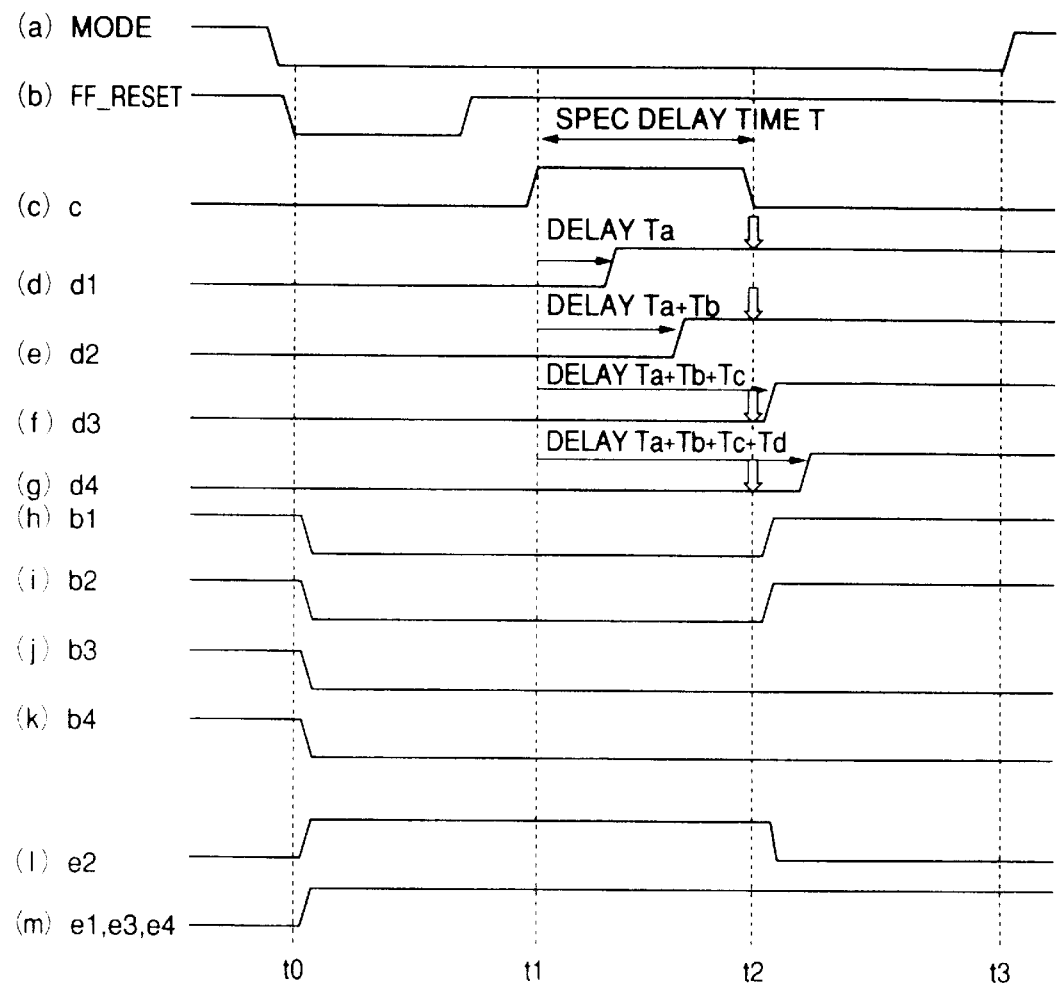
FIG. 2 shows a timing chart of the delay generation circuit shown in FIG. 1.

FIG. 2 shows a timing chart of the delay generation circuit shown in FIG. 1. In FIG. 2, description will be made about the case where a delay time in a delay circuit is desirably restricted within a spec delay time T.

The falling edge of the reference pulse signal c which is supplied to each of the registers 14a, 14b, 14c, and 14d is synchronized with the rising edge of the reference pulse signal c which is supplied to the flip flop 13 and makes its pulse width equal to the spec delay time T. The reference pulse signal c can have a pulse width which has a desired spec delay time T independently of conditions, such as a threshold of a transistor, gate length, voltage of a power supply, and operation temperature, since the reference pulse signal c is generated by the reference pulse generator 12.

The delay generation circuit 10 can adjust a delay time of an output delay signal by the following operations when a mode signal MODE becomes "0", for example, while the MPU is reset, or the MPU outputs a setup command.

When the MPU outputs the reset signal and the mode signal MODE becomes "0" at a time instant t0 ((a) in FIG. 2), the mode changeover switch 23 switches an input of the flip flop 13. That is, the first mode changeover switch connects an input terminal of the flip flop 13 to the power source Vdd, and the second mode changeover switch connects the clock terminal of the flip flop 13 to an output of the reference pulse generator 12.

Also, a flip flop reset generator 24 puts the flip flop reset signal FFRESET into "0" ((b) in FIG. 2) when the mode signal MODE falls down to "0".

The registers 14a, 14b, 14c, and 14d are initialized and set the detection signal b1 through b4 to "0" when the flip flop reset signal FFRESET falls down to "0" ((h) to (k) in FIG. 2). As a result, the selection signals e1 to e4 which are output from the selector 15a to 15d, respectively, and have a value "1" ((l) to (m) in FIG. 2). Thus, the setting switches 16a to 16d are turned off.

The flip flop reset signal FFRESET is again set to "1" when several nanoseconds lapse after the signal fell down to "0" ((b) in FIG. 2).

When the reference pulse generator 12 detects that the flip flop signal FFRESET becomes "1" at a time instant t1, "1" is produced as the reference pulse signal c ((c) in FIG. 2).

When the reference pulse signal c turns to "1", the flip flop 13 outputs "1" in synchronism with the rising edge of the reference pulse signal c ((d) in FIG. 2) since the input terminal of the flip flop 13 is connected to Vdd. The output is the reference delay signal d1 which rises at timing delayed by a delay time from a rising of the reference pulse signal c. The reference delay signal d1 is propagated through the delay circuits 11a, 11b, and 11c.

It is assumed that a duration time to pass through the delay circuit 11b is shorter than a pulse width of the reference pulse signal c and a duration time to pass through the delay circuit 11c is longer than the pulse width of the reference pulse signal c. That is, the delay time Ta of the reference delay signal d1 and the delay time (Ta+Tb) of the reference delay signal d2 are each shorter than a desired delay time T, and the delay time (Ta+Tb+Tc) of the reference delay signal d3 and a delay time (Ta+Tb+Tc+Td) of the reference delay signal d4 are each longer than the desired delay time T. Taking the above into consideration, descriptions will be made about an example hereinafter.

The delay circuit 11a outputs "1" as a reference delay signal d2 when the delay time Tb lapses after the reference delay signal d1 is supplied to the delay circuit 11a. Here, the rising of the reference delay signal d2 is delayed by a delay time (Ta+Tb) to be compared with the rising of the reference pulse signal c.

When the desired delay time, namely, the spec delay time T, lapses at a time instant t2 after the reference pulse signal c is turned into "1", the reference pulse signal c rendered into "0" ((c) in FIG. 2).

Each of the registers 14a, 14b, 14c, and 14d stores the reference delay signals d1, d2, d3, and d4, respectively, at a falling edge of the reference pulse signal c. At time t2, each of the registers 14a, 14b, 14c, and 14d stores "1", "1", "0", and "0", respectively, since the reference delay signal d1 and d2 have a value "1" and the reference delay signal d3 and d4 have a value "0" ((d) to (g) in FIG. 2). As a result, each of the registers 14a, 14b, 14c, and 14d outputs as the detection signal b1, b2, b3, and b4 values "1", "1", "0", and "0", respectively ((h) to (k) in FIG. 2).

When the detection signal b1 to b4 are determined, the detection signal b1 to b4 are supplied to the selectors 15a to 15d, respectively.

The selector 15a outputs a value "1" as the selection signal e1 ((m) in FIG. 2), since the selector 15a receives the detection signal b1 (="1") and an inverted value (="0") of the detection signal b2 (="1"), and performs NAND operation between them.

The selector 15b outputs a value "0" as the selection signal e2 ((l) in FIG. 2), since the selector 15b receives the detection signal b2 (="1") and an inverted value (="1") of the detection signal b3 (="0"), and performs NAND operation between them.

The selector 15c outputs a value "1" as the selection signal e3 ((m) in FIG. 2), since the selector 15c receives the detection signal b3 (="0") and an inverted value (="1") of the detection signal b4 (="0"), and performs NAND operation between them.

The selector 15d outputs a value "1" as the selection signal e4 ((m) in FIG. 2), since the selector 15d receives the detection signal b4 (="0") and the value is inverted.

The setting switch 16b is turned on and the setting switches 16a, 16c, and 16d are turned off, since the setting switches 16a, 16b, 16c, and 16d receives the selection signal e1 (="1"), e2 (="0"), e3 (="1"), and e4 (="1"), respectively. As a result, the setting switch 16b is set to select the reference delay signal d2 which passes through the delay circuit 11a.

On the other hand, the delay circuit 11b outputs "1" as the reference delay signal d3 ((f) in FIG. 2), when a short time lapses after the time instant t2, namely, the delay time Tc lapses after the reference delay signal d2 is supplied to the delay circuit 11b. Here, the rising edge of the reference delay signal d3 is delayed by the delay time (Ta+Tb+Tc) relative to the rising edge of the reference pulse signal c. Also, the delay time (Ta+Tb+Tc) is longer than the spec delay time T.

Similarly, the delay circuit 11c outputs "1" as the reference delay signal d4 ((g) in FIG. 2), when a delay time Td lapses after the reference delay signal d3 is supplied to the delay circuit 11c. Here, the rising edge of the reference delay signal d4 is delayed by a delay time (Ta+Tb+Tc+Td) relative to the rising edge of the reference pulse signal c. Also, the delay time (Ta+Tb+Tc+Td) is longer than the spec delay time T.

Consequently, it can be seen that the signal which has a delay time shorter than the spec delay time T and which is the closest to the spec delay time T is the reference delay signal d2.

When the mode signal MODE turns to "1" at the time instant t3 ((a) in FIG. 2), the mode changeover switch 23 is switched to the normal operation mode. That is, the first mode changeover switch connects a data input terminal of the flip flop 13 to the output SG of the internal circuit (not shown) of the semiconductor device. The second mode changeover switch connects a clock input terminal of the flip flop 13 to the output ICK of the internal clock generation circuit (not shown) of the semiconductor device.

When the output SG of the internal circuit is supplied to the flip flop 13 and the internal clock ICK rises, the flip flop 13 holds the output SG of the internal circuit. The output SG is delayed by a delay time (Ta+Tb) at the delay circuit 11a, and supplied to an output terminal 18 as an output delay signal through the setting switch 16b which is turned on and the inverter 17. As a result, it is possible to shorten a delay time of an output delay signal which is supplied to the output terminal 18 compared to a pulse width (spec delay time T) of the reference pulse signal c.

As described above, it is possible to set a delay time to a desired value by detecting both a delay time measured before the reference delay signal generated from the reference pulse signal c by the delay generation circuit 10 passes through the delay circuit and a delay time measured after the reference delay signal passes through the delay circuits, and by outputting, on the basis of the determination result, one of the signals that appears before the reference delay signal passes through the delay circuit or after the reference delay signal passes through the delay circuits.

Figure 3:
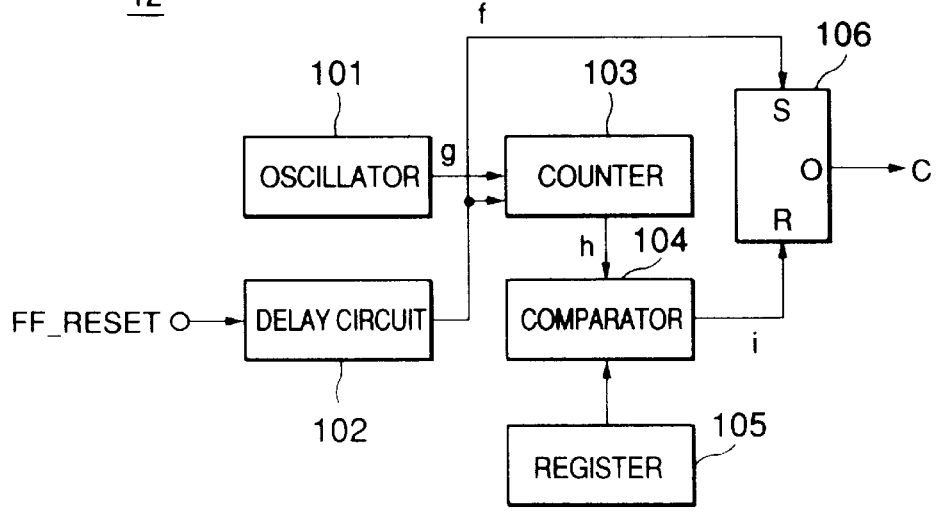
FIG. 3 shows a block diagram of a reference pulse generator shown in FIG. 1.

FIG. 3 shows a block diagram representing the reference pulse generator 12 shown in FIG. 1 more detail. In FIG. 3, the reference pulse generator 12 includes an oscillator 101, a delay circuit 102, a counter 103, a comparator 104, a register 105, and SR flip flop 106.

The oscillator 101 generates a clock g which has a clock period considerably shorter than the spec delay time T. The clock g is supplied as an output signal to the counter 103.

The delay circuit 102 delays the flip flop reset signal FFRESET and outputs a delayed reset signal f. The delayed reset signal f puts an SR flip flop 106 into a set state and resets the counter 103.

The counter 103 resets its own count value in response to the delayed reset signal f, and then counts the clock g from the oscillator 101. The count value is supplied to the comarator 104.

The comparator 104 compares the count value of the counter 103 with a value stored in the register 105. When the values are coincident with each other, the comparator 104 outputs a coincident signal i and supplies it to a reset terminal of the SR flip flop 106.

A value is set to the register 105. The value is calculated by dividing the spec delay time T by a cycle time of a clock from the oscillator 101. On the contrary, the spec delay time may be changed by replacing the value supplied to the register 105.

The SR flip flop 106 is set by an output of the delay circuit 102 and outputs a value "1", and is set by a reset of the comparator 104 and outputs a value "0". The output of the SR flip flop 106 is used as a reference pulse signal c. A period the output shows a value "1" corresponds to the spec delay time T.

Figure 4:
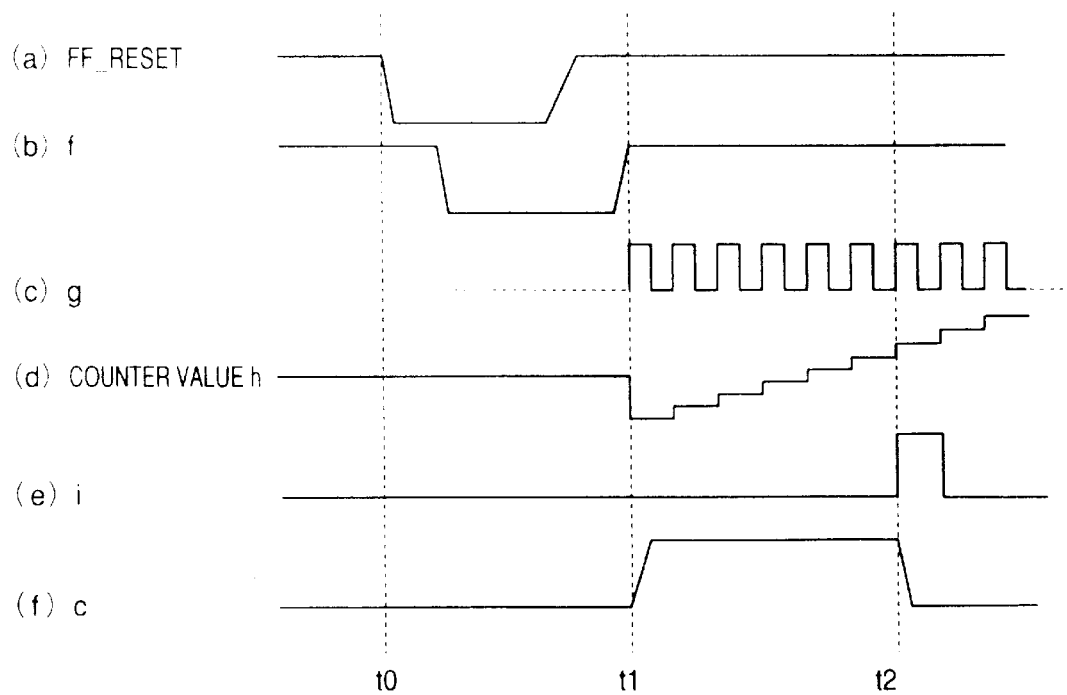
FIG. 4 shows a timing chart of a reference pulse generator shown in FIG. 3.

FIG. 4 shows a timing chart of the reference pulse generator shown in FIG. 3. Descriptions about operations of the reference pulse generator shown in FIG. 3 are made with reference to FIG. 4. Here, it is assumed that a value "6" is stored in the register 105.

When a flip flop reset signal FFRESET become "0" at time t0 ((a) in FIG. 4), the signal is delayed at the delay circuit 102 and the delay circuit 102 outputs a delayed reset signal f ((b) in FIG. 4).

When the delayed reset signal f rises to "1" at time t1 ((b) in FIG. 4), the SR flip flop 106 is set and the reference pulse signal c takes a value "1" ((f) in FIG. 4).

Also, when the delayed reset signal f rises to "1" at time t1 ((b) in FIG. 4), a counter 103 is initialized to set a count value to "0" and commences to count a clock g of the oscillator 101 ((d) in FIG. 4). The counter 103 is incremented at every time the clock g takes a value "1" and, as a result, the count value h is increased one by one, such as "0" to "1", "1" to "2", and so on.

When the count value h of the counter 103 takes a value "16" at t2, the comparator 104 detects that the count value is coincident with a value of the register 105 ("6"), and outputs a coincident signal i ((e) in FIG. 4). When the coincident signal takes a value "1", the SR flip flop 106 is reset, and the reference pulse signal c which is an output of the SR flip flop 106 is turned into "0" ((f) in FIG. 4).

As described above, by consecutively counting the clock g which is generated by the oscillator 101 and which is independent of a variation of the temperature or power source, it is possible to generate the reference pulse signal c which has a spec delay time T.

[Second embodiment of the invention]

Hereinafter, descriptions will be made about a delay generation circuit according to a second embodiment of the invention.

Figure 5:
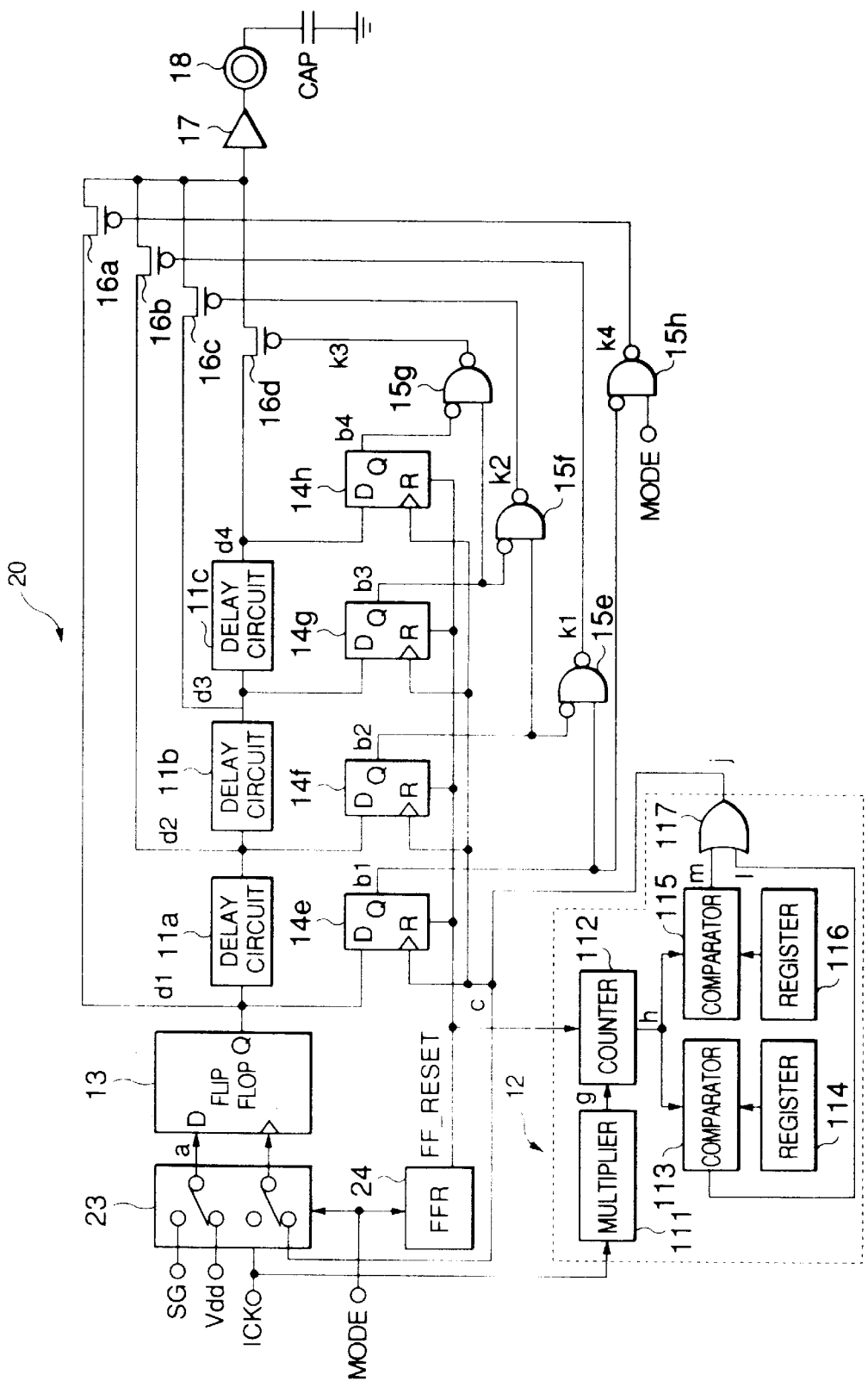
FIG. 5 shows a block diagram of a delay generation circuit of a semiconductor device according to a second embodiment of the invention.

FIG. 5 shows a block diagram of a delay generation circuit of a semiconductor device according to the second embodiment of the invention. In the embodiment, a signal from an internal circuit is controlled so that it has a delay time greater than a desired delay time (hereinafter, referred to as a spec delay time T) in comparison with a reference signal. The same blocks as the first embodiment are denoted by the same numerals and symbols as the first embodiment, and descriptions about the same blocks will be omitted.

As shown in FIG. 5, the delay generation circuit 20 supplied to the semiconductor device includes three delay circuits, which are incorporated beforehand, 11a, 11b, and 11c, a reference pulse generator 12, a flip flop 13, four registers 14e, 14f, 14g, and 14h, four selectors 15e, 15f, 15g, and 15h, four setting switches 16a, 16b, 16c, and 16d, a mode changeover switch 23, and a flip flop reset generator 24.

The reference pulse generator 12 outputs two reference pulse signals j, for example, for a reset duration. A pulse interval between the two reference pulse signals corresponds to the minimum delay time (spec delay time T) to be delayed at the delay circuit 11.

The reference pulse generator 12 of the second embodiment of the invention includes an M multiplier 111, a counter 112, comparators 113 and 115, registers 114 and 116, and an OR gate 117.

The M multiplier 111 generates a clock g which has a frequency equal to M times the frequency of the internal clock ICK oscillated by an MPU, by multiplying the internal clock ICK by M (M is a positive integer) by the use of, for example, a PLL. Here, the clock g has a clock period which is considerably shorter than the spec delay time T. The output g of the M multiplier 111 is supplied to the counter 112.

The counter 112 resets its own count value in response to the flip flop reset signal FFRESET, and then counts the clock g from the M multiplier 111. The count value h is supplied to the comarator 113 and 115.

The comparator 113 compares the count value of the counter 112 with a value stored in the register 114. When the values are coincident with each other, the comparator 113 outputs a coincident signal 1 and supplies it to the OR gate 117. The OR gate 117 outputs a first reference pulse signal j based on the coincident signal 1.

Similarly, the comparator 115 compares the count value of the counter 112 with a value stored in the register 116. When the values are coincident with each other, the comparator 115 outputs a coincident signal m and supplies it to the OR gate 117. The OR gate 117 outputs a second reference pulse signal j based on the coincident signal m.

The register 114 is operable to set a time duration from reset timing of the counter 112 to output timing of the first reference pulse signal j.

The register 116 is operable to set a time duration from output timing of the first reference pulse signal j to output timing of the second reference pulse signal j. A time interval between the first reference pulse signal j and the second reference pulse signal j corresponds to the spec delay time T. The spec delay time T can be changed by alternating values supplied to the registers 114 and 116.

Figure 6:
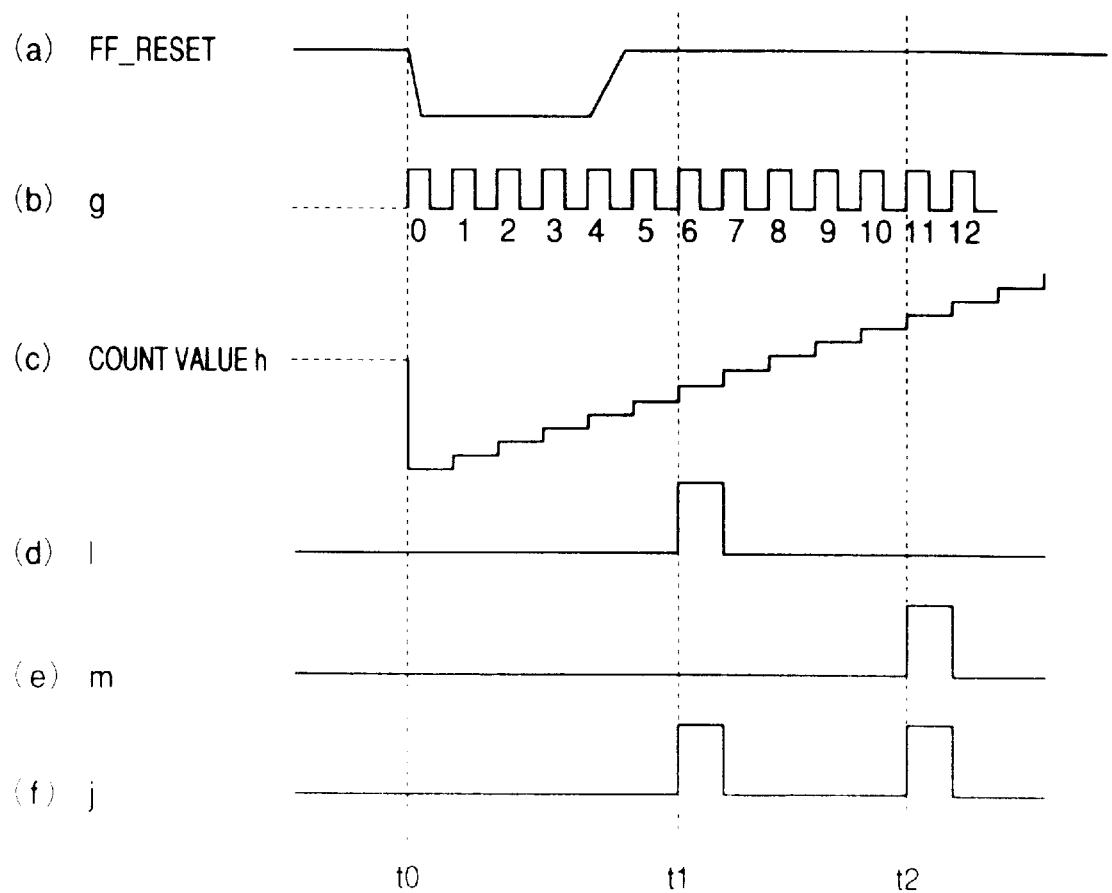
FIG. 6 shows a block diagram of a reference pulse generator shown in FIG. 5.

FIG. 6 shows a timing chart of the reference pulse generator shown in FIG. 5. Descriptions about operations of the reference pulse generator shown in FIG. 5 are made with reference to FIG. 6. Here, it is assumed that a value "6" is stored in the register 114 and a value "11" is stored in the register 116.

When a flip flop reset signal FFRESET become "0" at time t0 ((a) in FIG. 6), the counter 112 is initialized into a count value to "0" and commences to count a clock g of the M multiplier 111 ((b), (c) in FIG. 6). The counter 112 is incremented at every time the clock g takes a value "1" and, as a result, the count value h is incremented in a manner, such as "0" to "1", "1" to "2", and so on.

When the count value h of the counter 112 takes a value "6" at t1, the comparator 113 detects that the count value is coincident with a value of the register 114 ("6"), and outputs a coincident signal l ((d) in FIG. 6). Responsive to the coincident signal l, the OR gate 117 outputs the first reference pulse signal j ((f) in FIG. 6).

When the count value h of the counter 112 takes a value "11" at t2, the comparator 115 detects that the count value is coincident with a set value ("11") of the register 116, and outputs a coincident signal m ((e) in FIG. 6). Then, the coincident signal m is supplied to the OR gate 117 to be produced from the OR gate 117 as the second reference pulse signal j.

As described above, the reference pulse signals j having a spec delay time T which is equal to a time interval between the first and the second reference pulse signals j can be generated by multiplying the internal clock ICK by M at the M multiplier 111 and by counting the output clock g from the M multiplier 111 by the counter 112. Herein, it is to be noted that the internal clock ICK is independent of a variation of a temperature or a power source.

Also, the counter 112 may be initialized at a rising edge of the flip flop reset signal to generate the first reference pulse signal instead of using the comparator 113 and the register 114.

Returning to FIG. 5, each of the four registers 14e, 14f, 14g, and 14h includes a flip flop. The four registers 14e, 14f, 14g, and 14h are operable to store reference delay signals d1 to d4 in synchronism with the first and the second reference pulse signals j. Herein, the reference delay signal d1 appears prior to the delay circuit 11a while the reference delay signal d2 to d4 are produced after the delay circuit 11a, 11b, and 11c, respectively.

The reference delay signals d1, d2, d3, and d4, which are supplied to the registers 14e, 14f, 14g, and 14h, respectively, include delay times Ta, Ta+Tb, Ta+Tb+Tc, and Ta+Tb+Tc+Td in comparison with the rising edge of the first reference pulse signal j, respectively. Each of the registers 14e through 14h compares each reference delay signal d1 to d4 with the rising edge of the second reference pulse signal j and determines whether or not the corresponding delay times among Ta, Ta+Tb, Ta+Tb+Tc, and Ta+Tb+Tc+Td fall within a predetermined value to produce the detection signals b1 through b4.

Each of the four selectors 15e, 15f, 15g, and 15h is formed by a NAND gate. By using the determination signals b1, b2, b3, and b4 each of which is stored in the registers 14e, 14f, 14g, and 14h, each selector 15e, 15f, 15g, and 15h selects one of signals that is obtained before passing through the delay circuit 11a or after passing through the delay circuit 11a, 11b, or 11c to put one of the four setting switches 16a, 16b, 16c, and 16d into an on state and to put the other switches into an off state. Each of the setting switches 16a to 16d includes p-MOS transistor which is turned on in response to the first logic level "1" and which is turned off in response to the second logic level "0"

The mode changeover switch 23 serves to selectively supply a signal to the flip flop 13 in normal operation mode or setup operation mode. The illustrated mode changeover switch 23 has two sets of changeover switches. A first changeover switch connects a data input terminal of the flip flop 13 to an output terminal SG of an internal circuit (not shown) when the normal operation mode, and to a power source voltage Vdd when the setup operation mode. Here, the power source voltage Vdd is kept at the first logic level "1". A second changeover switch connects a clock input terminal to an output ICK of an internal clock generation circuit (not shown) when the normal operation mode, and to an output j of the reference pulse generator 12 when the setup operation mode.

The flip flop 13, synchronizing with a rising edge of an internal clock ICK which is supplied to a clock terminal, holds an output signal SG of an internal circuit (not shown) in the normal operation mode. On the other hand, in the setup operation mode, the flip flop 13, synchronizing with a rising edge of the first and the second reference pulse signals j, holds a level of a power supply Vdd and outputs a reference delay signal d1 which has a delay time Ta and is supplied from an output terminal Q of the flip flop 13. This reference delay signal d1 is then supplied to the delay circuit 11a, the register 14e, and the setting switch 16a. Here, the delay time Ta is supplied based on a timing of rising of the first reference pulse signal j.

The delay circuit 11a further delays the received reference delay signal d1 a delay time Tb, and outputs a reference delay signal d2 which has a delay time (Ta+Tb) This reference delay signal d2 is supplied to the delay circuit 11b, the register 14f, and setting switch 16b.

Similarly, a reference delay signal d3 which has a delay time (Ta+Tb+Tc) and is supplied from the delay circuit 11b is supplied to the delay circuit 11c, the register 14g, and setting switch 16c. Also, a reference delay signal d4 which has a delay time (Ta+Tb+Tc+Td) and is supplied from the delay circuit 11c is supplied to the delay circuit 11d, the register 14h, and setting switch 16d.

The register 14e is initialized by a reset signal (FFERESET) to hold the delay signal d1 at a falling edge of the reference pulse signal j and to output the detection signal b1. Similarly, the register 14f is initialized by the reset signal (FFRESET) to hold the delay signal d2 at the falling edge of the reference pulse signal j and to output the detection signal b2. The register 14g is initialized by a reset signal (FFRESET) to hold the delay signal d3 at the falling edge of the reference pulse signal j and to output the detection signal b3. The register 14h is initialized by a reset signal (FFRESET) to hold the delay signal d4 at the falling edge of the reference pulse signal j and to output the detection signal b4.

The selector 15e performs NAND operation between the detection signal b1 and an invert of the detection signal b2 to outputs a selection signal k1. Similarly, the selector 15f performs NAND operation between the detection signal b2 and an invert of the detection signal b3 to outputs a selection signal k2. Also, the selector 15g performs NAND operation between the detection signal b3 and an invert of the detection signal b4 to outputs a selection signal k3. The selector 15h performs NAND operation between the mode signal MODE and an inverted detection signal b1 to outputs a selection signal k4. Also, in the case where a value of an output terminal 18 is allowed to be changed in setup operation, the selector 15h may be removed and an output of the register 14e may be directly connected to a gate in the setting switch 16a.

The setting switch 16a has a gate supplied with the selection signal k4 and controls production of the reference delay signal d1. Similarly, the setting switch 16b has a gate supplied with the selection signal k1 and controls production of the reference delay signal d2. Also, the setting switch 16c has a gate supplied with the selection signal k2 and controls production of the reference delay signal d3. The setting switch 16d has a gate given the selection signal k3 and controls production of the reference delay signal d4.

In the setup operation mode, one of the setting switches 16a, 16b, 16c, and 16d is selected based on the selection signal k1 to k4 to supply one of the reference delay signal d1, d2, d3, and d4 to an inverter 17. In the normal operation mode, the signal SG of the internal circuit is supplied to the inverter 17 through one of the setting switches 16a, 16b, 16c, and 16d, and an output of the switch is supplied as an output delay signal outwards through the output terminal 18.

Figure 7:
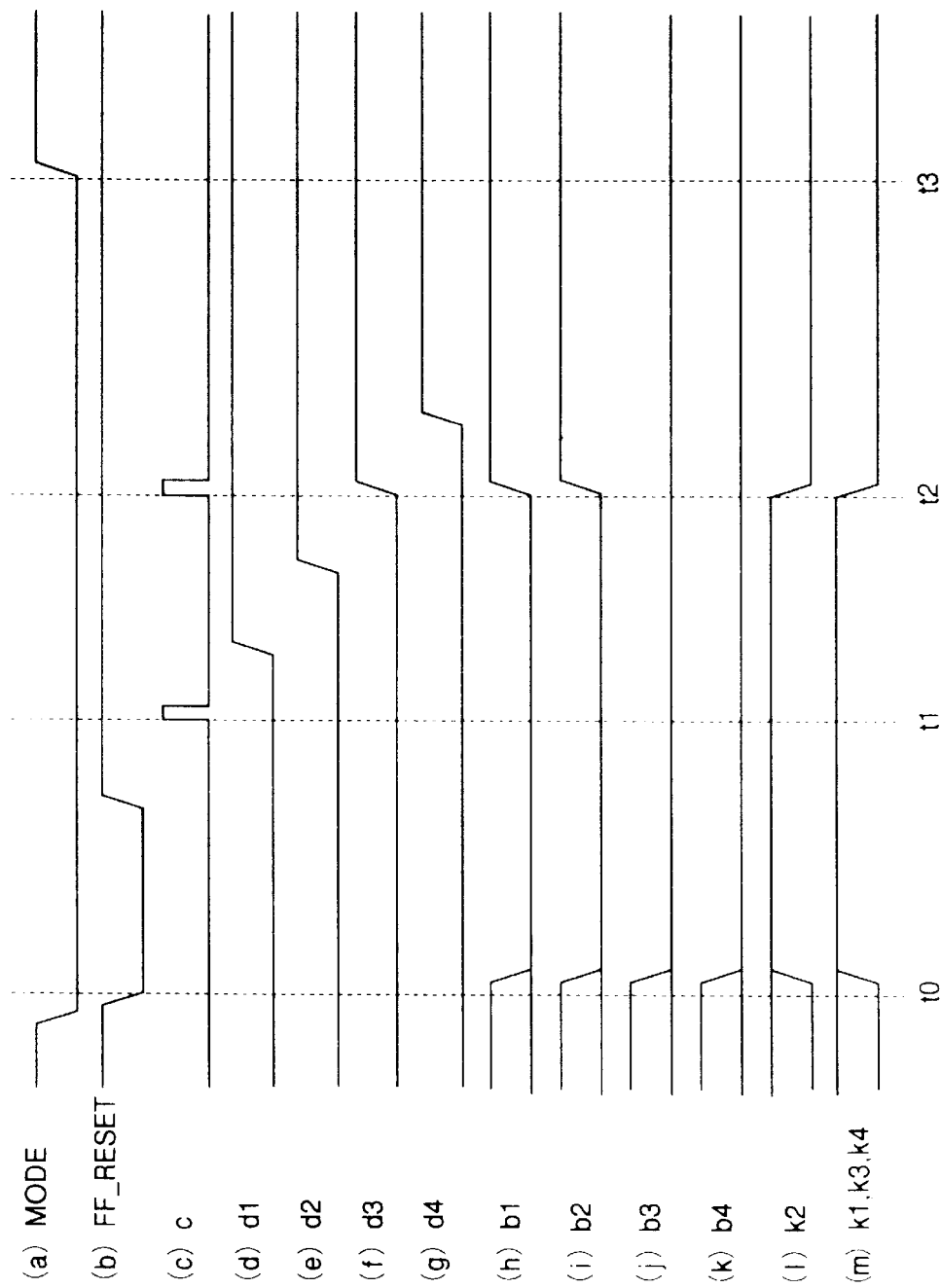
FIG. 7 shows a timing chart of the delay generation circuit shown in FIG. 5.

FIG. 7 shows a timing chart of the delay generation circuit shown in FIG. 5. As shown in FIG. 7, descriptions will be made about the case where a delay time of a delay circuit supplied to the output terminal 18 is greater than a spec delay time T.

A rising edge of a reference pulse signal j which is supplied to each of the registers 14e, 14f, 14g, and 14h is synchronized with a rising edge of a reference pulse signal j which is supplied to flip flop 13 and makes a pulse interval between the first and the second reference pulse signals j equal to the spec delay time T. The pulse interval between the first and the second reference pulse signals j makes it possible to be equal to the desired spec delay time T because the first and the second reference pulse signals are generated independently of conditions, such as a threshold of a transistor, gate length, a voltage of a power source, and an operation temperature. This is because the first and the second reference pulse signals j are generated by the reference pulse generator 12.

The delay generation circuit 20 can adjust a delay time of an output delay signal by the following operations when a mode signal MODE becomes "0", for example, while the MPU is reset, or the MPU outputs a setup command.

When the MPU outputs a reset signal and the mode signal MODE becomes "0" at time t0 ((a) in FIG. 7), the mode changeover switch 23 switches an input of the flip flop 13. That is, the first mode changeover switch connects an input terminal D of the flip flop 13 to the power source Vdd, and the second mode changeover switch connects a clock input terminal C of the flip flop 13 to an output of the reference pulse generator 12.

Also, a flip flop reset generator 24 puts a flip flop reset signal FFRESET into "0" ((b) in FIG. 7) when the mode signal MODE is rendered into "0".

The registers 14e, 14f, 14g, and 14h are initialized and put the detection signal b1 through b4 into "0" when the flip flop reset signal FFRESET falls down to "0" ((h) to (k) in FIG. 7). As a result, the selection signals k1 to k4 which are output from the selector 15e to 15h, respectively, have a value "1" ((l) to (m) in FIG. 7) while the setting switches 16a to 16d are turned off.

The flip flop reset signal FFRESET is again set to "1" when several nanoseconds lapse after the signal falls down to "0" ((b) in FIG. 7).

When the reference pulse generator 12 detects that the flip flop signal FFRESET becomes "1" at time t1, it outputs "1" as the reference pulse signal j ((c) in FIG. 7). In the embodiment of the invention, a pulse width of the reference pulse signal j is considerably shorter than the spec delay time T, and it is just enough to have a pulse width required for holding operation of the flip flop 13 or the register 14.

When the reference pulse signal j is turned into "1", the flip flop 13 receives a value of Vdd and outputs "1" in synchronism with a rising edge of the first reference pulse signal j ((d) in FIG. 7) since the input terminal D of the flip flop 13 is connected to Vdd. The output is produced as the reference delay signal d1 which rises at timing delayed by a delay time Ta from a rising edge of the first reference pulse signal j. The reference delay signal d1 is propagated through the delay circuits 11a, 11b, and 11c.

It is assumed that a duration time to pass through the delay circuit 11b is shorter than a pulse interval of the first and the second reference pulse signals j and a duration time to pass through the delay circuit 11c is longer than a pulse interval of the first and the second reference pulse signal j. That is, a delay time Ta of the reference delay signal d1 and a delay time (Ta+Tb) of the reference delay signal d2 are each shorter than a desired delay time T, and a delay time (Ta+Tb+Tc) of the reference delay signal d3 and a delay time (Ta+Tb+Tc+Td) of the reference delay signal d4 are each longer than a desired delay time T. Descriptions of an example in such a case are made hereinafter.

The delay circuit 11a outputs "1" as a reference delay signal d2 when the delay time Tb lapses after the reference delay signal d1 is supplied to the delay circuit 11a. Here, a rising edge of the reference delay signal d2 is delayed by a delay time (Ta+Tb) as compared with a rising edge of the first reference pulse signal j.

The first reference pulse signal j is also supplied to the register 14e through 14h, but even if the reference delay signals d1 through d4 are received, the outputs b1 through b4 are still kept at "0" at this time instant because the reference delay signals d1 through d4 take "0".

At time t2, the second reference pulse signal j becomes "1" ((c) in FIG. 7). The second reference pulse signal j is also supplied to the flip flop 13, but at this time instant, the output of the flip flop 13 (d1) is still kept at "1" since the data output terminal D of the flip flop 13 is still held at "1".

The registers 14e, 14f, 14g, and 14h store the reference delay signals d1, d2, d3, and d4, respectively, at a falling edge of the second reference pulse signal j. At time t2, the registers 14e, 14f, 14g, and 14h store "1", "1", "0", and "0", respectively, since each of the reference delay signals d1 and d2 has a value "1" and each of the reference delay signals d3 and d4 have a value "0" ((d) to (g) in FIG. 7). As a result, the registers 14e, 14f, 14g, and 14h output, as the detection signals b1, b2, b3, and b4, values "1", "1", "0", and "0", respectively ((h) to (k) in FIG. 7).

When the detection signal b1 to b4 are determined in the above-mentioned manner, the detection signals b1 to b4 are supplied to the selectors 15e, 15f, 15g, and 15h, respectively.

The selector 15e outputs a value "1" as the selection signal k1 ((m) in FIG. 7), since the selector 15e receives the detection signal b1 (="1") and an inverted value (="0") of the detection signal b2 (="1"), and performs NAND operation between them.

The selector 15f outputs a value "0" as the selection signal k2 ((l) in FIG. 7), since the selector 15f receives the detection signal b2 (="1") and an inverted value (="1") of the detection signal b3 (="0"), and performs NAND operation between them.

The selector 15g outputs a value "1" as the selection signal k3 ((m) in FIG. 7), since the selector 15g receives the detection signal b3 (="0") and an inverted value (="1") of the detection signal b4 (="0"), and performs NAND operation between them.

The selector 15h outputs a value "1" as the selection signal k4 ((m) in FIG. 7), since the selector 15h receives the mode signal MODE (="0") and an inverted value (="0") of the detection signal b1 (="1"), and performs NAND operation between them.

The setting switch 16c is turned on and the setting switches 16a, 16b, and 16d are turned off, since the setting switches 16a, 16b, 16c, and 16d receive the selection signal k1 (="1"), k2 (="1"), k3 (="0"), and k4 (="1") respectively. As a result, the setting switch 16c is set to select the reference delay signal d3 which passes through the delay circuit 11a.

On the other hand, the delay circuit 11b outputs "1" as the reference delay signal d3 ((f) in FIG. 7), when a short time lapses after time t2, namely, a delay time Tc lapses after the reference delay signal d2 is supplied to the delay circuit 11b. Here, a rising edge of the reference delay signal d3 is delayed by a delay time (Ta+Tb+Tc) as compared with a rising edge of the first reference pulse signal j. Also, the delay time (Ta+Tb+Tc) is longer than the spec delay time T.

Similarly, the delay circuit 11c outputs "1" as the reference delay signal d4 ((g) in FIG. 7), when a delay time Td lapses after the reference delay signal d3 is supplied to the delay circuit 11c. Here, a rising edge of the reference delay signal d4 is delayed by a delay time (Ta+Tb+Tc+Td) in comparison with a rising edge of the reference pulse signal j. Also, the delay time (Ta+Tb+Tc+Td) is longer than the spec delay time T.

Consequently, it can be seen that the signal which has a delay time longer than the spec delay time T and which is the closest to the spec delay time T is the reference delay signal d3.

When the mode signal MODE turns to "1" at the time instant t3 ((a) in FIG. 7), the mode changeover switch 23 is switched to the normal operation mode. That is, the first mode changeover switch connects a data input terminal of the flip flop 13 to an output SG of an internal circuit (not shown) of the semiconductor device. The second mode changeover switch connects a clock input terminal of the flip flop 13 to the output ICK of the internal clock generation circuit (not shown) of the semiconductor device.

When the output SG of the internal circuit is supplied to the flip flop 13 and the internal clock ICK rises, the flip flop 13 holds the output SG of the internal circuit. The output SG is delayed by a delay time (Ta+Tb+Tc) at the delay circuit 11a and 11b, and supplied to an output terminal 18 as an output delay signal through the setting switch 16c which is turned on and the inverter 17. As a result, it is possible to adjust a delay time of an output delay signal which is supplied to the output terminal 18 so that the delay time may be longer than a pulse interval of the first and the second reference pulse signal j (spec delay time T) and may be the closest to the pulse width.

As described above, it is possible to set a delay time to a desired value by detecting both a delay time measured before the reference delay signal generated from the first and the second reference pulse signals j by the delay generation circuit 10 passes through the delay circuit and a delay time measured after the reference delay signal passes through the delay circuits, and by outputting, on the basis of the determination result, one of the signals that appears before the reference delay signal passes through the delay circuit or after the reference delay signal passes through the delay circuits.

[Third embodiment of the invention]

Figure 8:
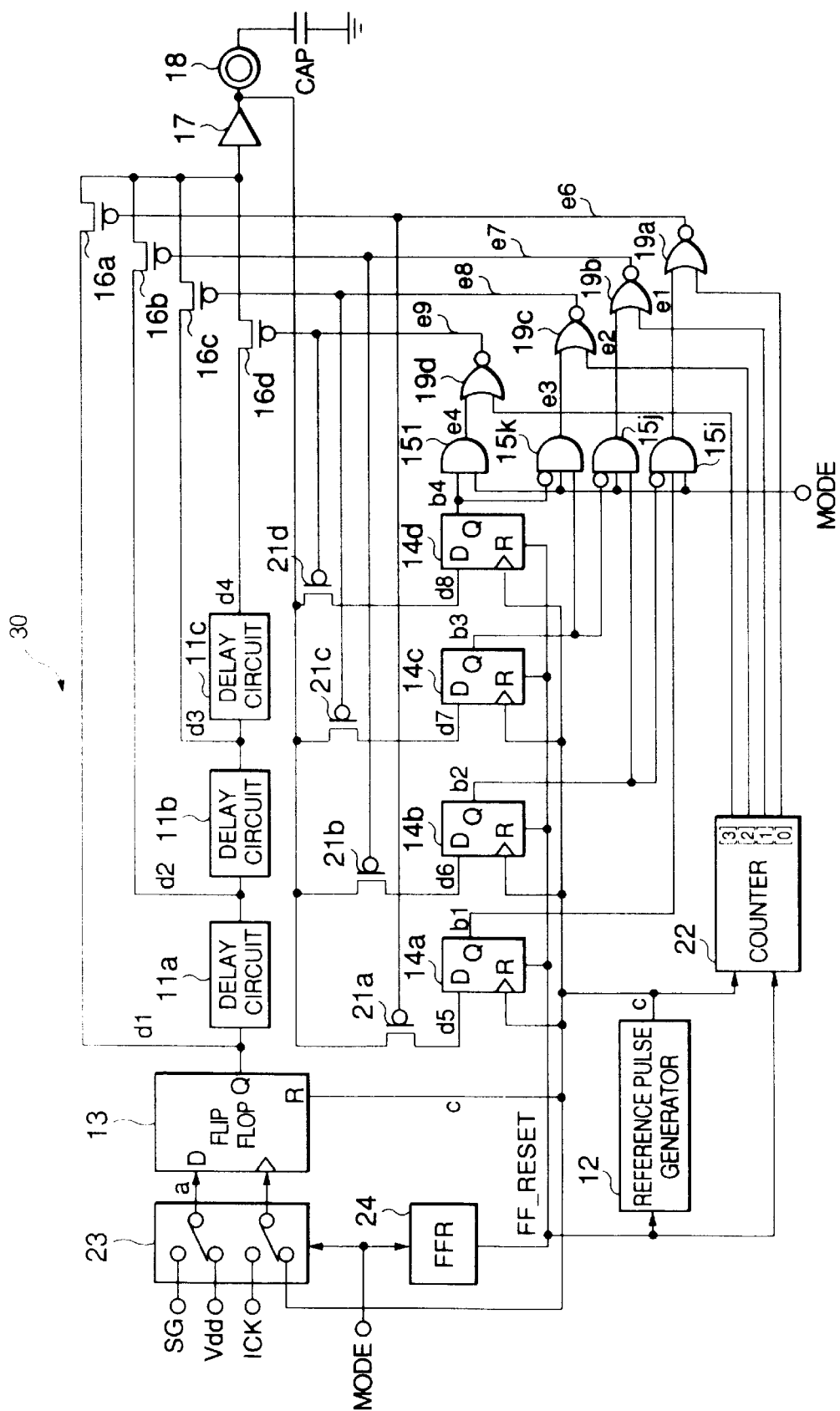
FIG. 8 shows a block diagram of a delay generation circuit of a semiconductor device according to a third embodiment of the invention.

FIG. 8 shows a block diagram of a delay generation circuit of a semiconductor device according to the third embodiment of the invention. As shown in FIG. 8, the delay generation circuit 30 supplied to the semiconductor device is configured to determine a delay time in consideration of a load capacity CAP by feeding back an output delay signal supplied to an output terminal to four registers 14a, 14b, 14c, and 14d. In the embodiment also, a signal from an internal circuit is controlled not to exceed a desired spec delay time T as compared with a reference signal.

As shown in FIG. 8, the delay generation circuit 30 supplied to the semiconductor device includes three delay circuits, which are incorporated beforehand, 11a, 11b, and 11c, a reference pulse generator 12, a flip flop 13, four registers 14a, 14b, 14c, and 14d, four selectors 15i, 15j, 15k, and 15l, four setting switches 16a, 16b, 16c, and 16d, a buffer 17, an output terminal 18 having a load capacity CAP, four NOR gates 19a, 19b, 19c, and 19d, four sampling switches 21a, 21b, 21c, and 21d, a counter 22, a mode changeover switch 23, and a flip flop reset generator 24. The same blocks as the first embodiment are denoted by the same numerical symbol as the first embodiment, and descriptions about the blocks are omitted.

The reference pulse generator 12 of the embodiment generates a reference pulse signal c. The reference pulse signal c corresponds to the number of the register 14, "4", and a pulse width of the reference pulse signal c corresponds to the spec delay time T.

An input of the buffer 17 is connected to drains of the setting switches 16a to 16d while an output of the buffer 17 is connected to the sources of the sampling switches 21a to 21d.

Each of the four registers 14a, 14b, 14c, and 14d is formed by a flip flop. Inputs D of the registers 14a, 14b, 14c, and 14d are each connected to the drains of the sampling switches 21a, 21b, 21c, and 21d, respectively. The registers 14a, 14b, 14c, and 14d store the output signal from the corresponding sampling switches 21a to 21d in synchronism with a falling edge of the reference pulse signal c.

The counter 22 is initialized in the setup operation mode to set a count value to "0000" by a flip flop signal FFRESET. Also, the counter 22 increments the count value at every time the reference pulse signal c takes a value "1" and, as a result, outputs the count values "0001", "0010", "0100", and "1000", in sequence. Here, the most significant digit of the count value corresponds to an output of a terminal (3) and the least significant digit of the count value corresponds to an output of a terminal (0).

Also, in the normal operation mode, the counter 22 outputs a value "0000".

One input terminals of the NOR gates 19a to 19d are each connected to output terminals (0) to (3) of the counter 22. The other input terminals are each connected to outputs of the selectors 15i to 15k and an output of the register 14d. Outputs of the NOR gates 19a to 19d are each connected to both gates of the setting switches 16a to 16d and gates of the sampling switches 21a to 21d. Each of the sampling switches 21a to 21d consists of pMOS transistor, and turns on when the gate is given "0" and, on the contrary, turns off when the gate is given "1".

The NOR gates 19a to 19d supply outputs e1 to e4 of the selector 15i to 15l as selection signals e5 to e8, respectively.

The NOR gates 19a to 19d supply an output of the counter 22 to the setting switches 16a to 16d and the sampling switches 19a to 19d, in the setup operation mode. For example, when the output of the counter 22 is "0001", an output e5 of the NOR gate 19a becomes "0" and outputs e6 to e8 of the NOR gate 19b to 19d become "1". Therefore, the setting switch 16a and the sampling switch 21a are turned on and the other switches are turned off. Thereby, the reference delay signal d1 is supplied to an input D of the register 14a via the setting switch 16a, the buffer 17, and the sampling switch 21a. At this point, a delay time Ta including an influence of a load capacity CAP can be sampled since the load capacity CAP which results from a wiring or the like is connected to the buffer 17 via the output terminal 18.

Similarly, when the output of the counter 22 is "0010", the switches 16b and 21b are turned on and the reference delay signal d2 is supplied to the register 14b. When the output of the counter 22 is "0100", the switches 16c and 21c are turned on and the reference delay signal d3 is supplied to the register 14c. When the output of the counter 22 is "1000", the switches 16d and 21d are turned on and the reference delay signal d4 is supplied to the register 14d The reference delay signal d1 before passing through the delay circuit 11a and the reference delay signals d2, d3, and d4 after passing through the delay circuits 11a, 11b, and 11c, respectively, are supplied to the registers 14a to 14d, respectively, via the setting switches 16a to 16d, and the buffer 17, and the sampling switches 21a to 21d. Therefore, the reference delay signals d5, d6, d7 and d8 supplied to the registers 14a, 14b, 14c, and 14d, respectively, have delay times, as compared with rising edges of the reference pulse signal c, Ta+α, Ta+Tb+α, Ta+Tb+Tc+α, and Ta+Tb+Tc+Td+α, respectively. Here, α is a delay value occurred in the setting switches 16a to 16d, the buffer 17, and the sampling switch 21a to 21d.

Each of the registers 14a to 14d determines that the corresponding one of the delay times Ta+α, Ta+Tb+α, Ta+Tb+Tc+α, and Ta+Tb+Tc+Td+α, as compared with a falling time instant of the reference signal c, falls within a predetermined range and produces each detection signal b1 to b4. In this embodiment, it is determined that each of the delay signals d5 to d8 arrives before lapse of the spec delay time T by fetching the input D of the register at the rising edge of the reference pulse signal c.

Each of the three selectors 15i to 15k includes an AND gate having three inputs. The selector 15l has an AND gate having two inputs. A mode signal MODE is supplied to each input of the four selectors 15i to 15l. In the setup operation mode, outputs of the selector 15i to 15l become "0" since the mode signal MODE take "0".

In the normal operation mode, when the mode signal MODE takes a value "1", the selectors 15i to 15l output a selection signal to select one of the signals before passing through the delay circuit 11a and after passing through the delay circuit 11a, 11b, and 11c based on the determination signals b1 to b4 stored in the registers 14a to 14d. Either one of the outputs of the selectors 15i to 15l becomes "1" and the remaining ones become "0". The outputs are inverted by the NOR gates 19a to 19d, and one of the four setting switches 16a, 16b, 16c, and 16d is turned on and the others are turned off.

The register 14a is initialized by a reset signal (FFRESET), and produces a value "1" in this embodiment. Also, the register 14a holds the reference delay signal d5 at a falling edge of the first reference pulse signal c, and outputs the detection signal b1. Here, the reference delay signal d5 is obtained by allowing the reference delay signal d1 to pass through the setting switch 16a, the buffer 17, and the sampling switch 21a.

Similarly, the register 14b is initialized by the reset signal (FFRESET), holds the reference delay signal d6 at a falling edge of the second reference pulse signal c, and outputs the detection signal b2. At this point, the second reference pulse signal c is supplied to the registers 14a, 14c, and 14d, but since the sampling switches 21a, 21c, and 21d are turned off, a state before a rising edge of the second reference pulse signal c can be kept intact.

Similarly, the register 14c is initialized by the reset signal (FFRESET), holds the reference delay signal d7 at a falling edge of the third reference pulse signal c, and outputs the detection signal b3. The register 14d is initialized by the reset signal (FFRESET) to hold the reference delay signal d8 at a falling edge of the fourth reference pulse signal c and to output the detection signal b4.

The selector 15i performs AND operation between the mode signal MODE and an invert of the detection signal b1 to output a selection signal e1. Similarly, the selector 15j performs AND operation between the mode signal MODE and an invert of the detection signal b3 to output a selection signal e2. Also, the selector 15k performs AND operation between the mode signal MODE and an invert of the detection signal b4 to output a selection signal e3. The selector 15l performs AND operation between the mode signal MODE and the detection signal b4 to output a selection signal e4.

The setting switch 16a controls inputting of the selection signal e5 to a gate and outputting the reference delay signal d1. Similarly, the setting switch 16b controls inputting of the selection signal e6 to a gate and outputting the reference delay signal d2. Also, the setting switch 16c controls inputting of the selection signal e7 to a gate and outputting the reference delay signal d3. The setting switch 16d controls inputting of the selection signal e8 to a gate and outputting the reference delay signal d4.

In the setup operation mode, one of the setting switches 16a, 16b, 16c, and 16d is selected based on the selection signal e5 to e8, one of the reference delay signal d1, d2, d3, and d4 is supplied to the inverter 17. An output of the inverter 17 is supplied to the registers 14a to 14d via one of the sampling switches 21a to 21d.

In the normal operation mode, the signal SG of the internal circuit is supplied to the inverter 17 through the flip flop 13 (and the delay circuit 11) and one of the setting switches 16a, 16b, 16c, and 16d, and an output of the inverter 17 is supplied as an output delay signal outwards through an output terminal 18.

Figure 9:
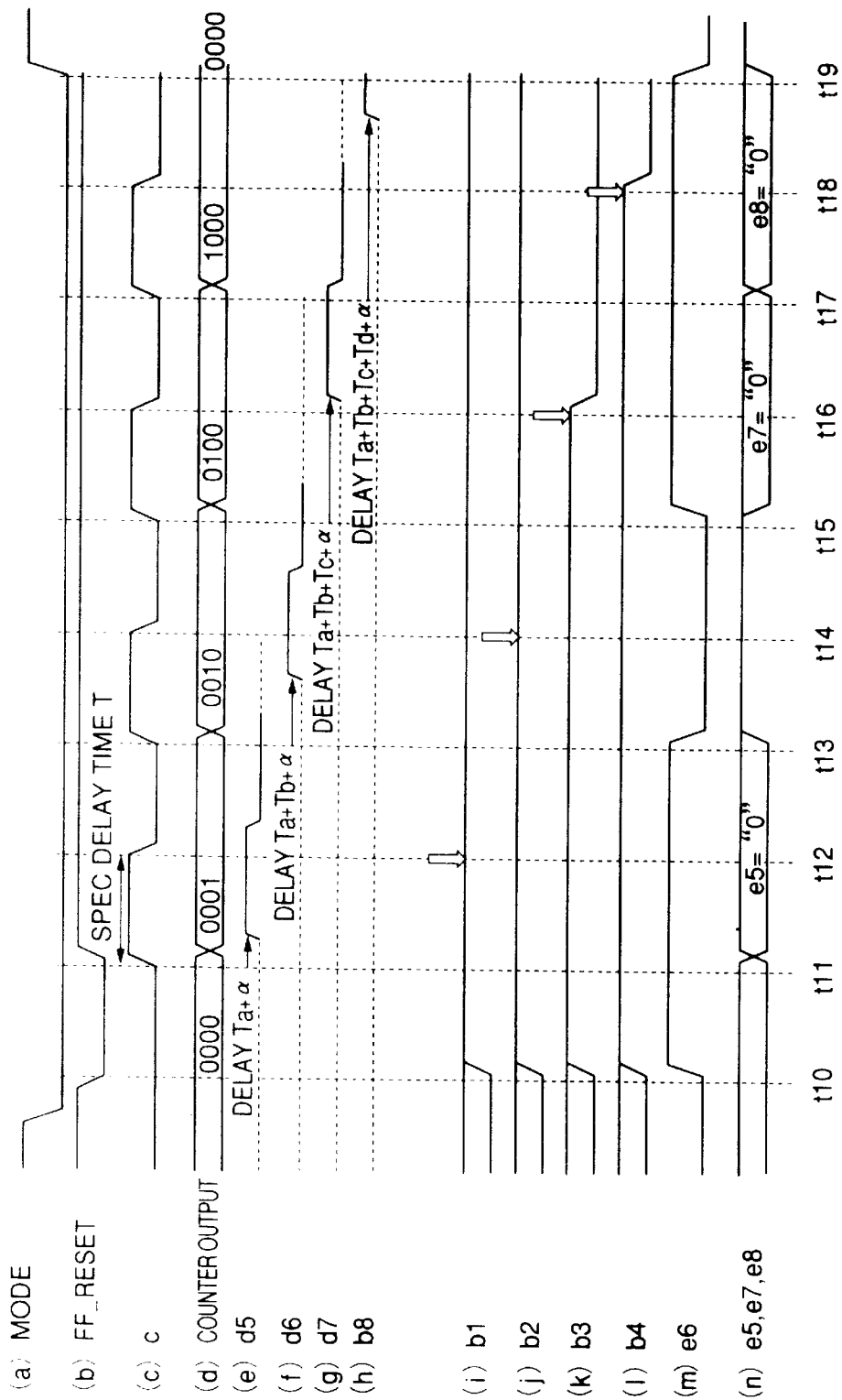
FIG. 9 shows a timing chart of the delay generation circuit shown in FIG. 8.

FIG. 9 shows a timing chart of the delay generation circuit shown in FIG. 8. As shown in FIG. 9, descriptions about when a delay time in a delay circuit supplied to the output terminal 18 is intend to limit below a spec delay time T.

A falling edge of a reference pulse signal c which is supplied to each of the registers 14a, 14b, 14c, and 14d synchronizes with a rising edge of a reference pulse signal c which is supplied to flip flop 13 and makes its pulse width equal to the spec delay time T. The reference pulse signal c can have a pulse width which has a desired spec delay time T independently of conditions such as a threshold of a transistor, gate length, voltage of a power supply, and operation temperature, since the reference pulse signal c is generated by the reference pulse generator 12.

The delay generation circuit 30 can adjust a delay time of an output delay signal by the following operations when a mode signal MODE becomes "0", for example, while the MPU is reset, or the MPU outputs a setup command.

When the MPU outputs a reset signal and the mode signal MODE becomes "0" at time t10 ((a) in FIG. 9), the mode changeover switch 23 switches an input of the flip flop 13. That is, a first mode changeover switch connects an input terminal of the flip flop 13 to the power supply Vdd, and a second mode changeover switch connects a clock input terminal D of the flip flop 13 to an output c of the reference pulse generator 12.

Also, a flip flop reset generator 24 sets a flip flop reset signal FFRESET to "0" ((b) in FIG. 9) when the mode signal MODE falls to "0".

The registers 14a, 14b, 14c, and 14d are initialized and sets the detection signal b1 through b4 to "0" when the flip flop reset signal FFRESET falls to "0" ((i) to (l) in FIG. 9). The counter 22 is also initialized to outputs "0000".

The selection signal e1 to e4 which are output from the selector 15i to 15l are "0" ((m) to (n) in FIG. 9), since the mode signal MODE is "0" at t10. Also, the setting switches 16a to 16d and the sampling switches 21a to 21d are all turned off since the output of the counter 22 is "0000".

The flip flop reset signal FFRESET is again set to "1" when several ns passed after the signal fell to "0" ((b) in FIG. 9).

When the reference pulse generator 12 detects that the flip flop signal FFRESET becomes "1" at time t11, it outputs "1" as the first reference pulse signal c ((c) in FIG. 9).

When the first reference pulse signal c turns to "1", the flip flop 13 outputs "1" synchronizing with a rising of the first reference pulse signal c ((e) in FIG. 9) since the input terminal of the flip flop 13 is connected to Vdd. The output is the reference delay signal d1 which rises at timing delayed a delay time from a rising of the first reference pulse signal c. The reference delay signal d1 is propagated through the delay circuits 11a, 11b, and 11c.

On the other hand, the counter 22 increments a count value to output "0001" when the first reference pulse signal c becomes "1" ((d) in FIG. 9). When the output terminal (0) of the counter 22 takes a value "1", the output e5 of the NOR gate 19a become "0" ((n) in FIG. 9) and the setting switch 16a and the sampling switch 21a are turned on. Also, the setting switches 16b to 16d and the sampling switches 21b to 21d are turned off since the outputs e6 to e8 of the NOR gate 19b to 19d are "1" ((m), (n) in FIG. 9).

The reference delay signal d1 having a delay time Ta is supplied to the register 14a as the reference delay signal d5 through the setting switch 16a, buffer 17, and the sampling switch 21a. A delay time α is added to a delay time of the reference delay signal d5 since the signal d5 passes through the setting switch 16a, buffer 17, and the sampling switch 21a. Thereby the signal d5 rises with a delay time (Ta+α)

When the first reference pulse signal c turns to "0" at t12, the register 14a receives the reference delay signal d5 in synchronism with a falling edge of the first reference pulse signal c and outputs "1" as the detection signal b1 ((i) in FIG. 9). At this point, the first reference pulse signal c is supplied to the register 14a, 14c, and 14d, but since the sampling switches 21b to 21d is turned off, outputs b2 to b4 of the register 14b to 14d are not changed.

Then, when the first reference pulse signal c turns to "0" ((c) in FIG. 9), the flip flop 13 is reset, the reference delay signal d1 which is an output of the flip flop 13 becomes "0", and the signal d1 is propagated through the delay circuit 11a, 11b, and 11c.

When the second reference pulse signal c turns to "1" at t13, the flip flop 13 supplies "1" in synchronism with a rising edge of the second reference pulse signal c since an input terminal of the flip flop 13 is connected to Vdd. The output is supplied to the delay circuit 11a. The delay circuit 11a produces "1" as the reference delay signal d2 when a delay time Tb lapses after reception of the reference delay signal d1. The reference delay signal d2 rises with a delay time (Ta+Tb) from a rising edge of the second reference pulse signal c.

The counter 22 increments a count value by 1 to output "0010" when the second reference pulse signal c becomes "1" ((d) in FIG. 9). When the output terminal (1) of the counter 22 takes a value "1", the output e6 of the NOR gate 19b become "0" ((n) in FIG. 9) and the setting switch 16b and the sampling switch 21b are turned on. Also, the setting switches 16a, 16c, and 16d and the sampling switches 21a, 21c, and 21d are turned off since the outputs e5, e7, and e8 of the NOR gate 19a, 19c, and 19d are "1" ((n) in FIG. 9).

The reference delay signal d2 having a delay time (Ta+Tb) is supplied to the register 14b as the reference delay signal d6 through the setting switch 16b, buffer 17, and the sampling switch 21b. A delay time α is added to a delay time of the reference delay signal d6 since the signal d6 passes through the setting switch 16b, buffer 17, and the sampling switch 21b. Thereby the signal d6 rises with a delay time (Ta+Tb+α)

It is assumed that a duration time to pass through the delay circuit 11b and the buffer 17 is shorter than a pulse width of the first reference pulse signals c, namely, a spec delay time T and a duration time to pass through the delay circuit 11c and the buffer 17 is longer than a pulse width of the first reference pulse signal c. That is, a delay time (Ta+α) of the reference delay signal d5 and a delay time (Ta+Tb+α) of the reference delay signal d6 are each shorter than a spec delay time T, and a delay time (Ta+Tb+Tc+α) of the reference delay signal d7 and a delay time (Ta+Tb+Tc+Td+α) of the reference delay signal d8 are each longer than a spec delay time T. Descriptions of an example in such a case will be made hereinafter.

A second reference pulse signal c fall to "0", when the spec delay time T passes after the second reference pulse signal c becomes "1" at time t14 ((c) in FIG. 9).

The register 14b stores the reference delay signal d6 at a falling edge of the second reference pulse signal c. The register 14b stores "1" as a detection signal b2 ((j) in FIG. 9) since the reference delay signal d6 is "1" at time t14 ((f) in FIG. 9).

When the third reference pulse signal c turns to "1" at time t15, the flip flop 13 supplies "1" in synchronism with a rising edge of the third reference pulse signal c since an input terminal of the flip flop 13 is connected to Vdd. The output is supplied to the delay circuit 11b through the delay circuit 11a. The delay circuit 11b produces "1" as the reference delay signal d3 when a delay time (Tb+Tc) passes after inputting of the reference delay signal d1. The reference delay signal d3 rises with a delay time (Ta+Tb+Tc) from a rising edge of the third reference pulse signal c.

The counter 22 increments a count value by 1 to output "10100", when the third reference pulse signal c becomes "1" ((d) in FIG. 9). When the output terminal (2) of the counter 22 takes a value "1", the output e7 of the NOR gate 19c become "0" ((n) in FIG. 9) and the setting switch 16c and the sampling switch 21c are turned on. Also, the setting switches 16a, 16b, and 16d and the sampling switches 21a, 21b, and 21d are turned off since the outputs e5, e6, and e8 of the NOR gate 19a, 19b, and 19d are "1" ((m), (n) in FIG. 9).

The reference delay signal d3 having a delay time (Ta+Tb+Tc) is supplied to the register 14c as the reference delay signal d7 through the setting switch 16c, the buffer 17, and the sampling switch 21c. A delay time α is added to a delay time of the reference delay signal d7 since the signal d7 passes through the setting switch 16c, buffer 17, and the sampling switch 21c. Thereby, the signal d7 rises with a delay time (Ta+Tb+Tc+α).

A third reference pulse signal c fall down to "0", when the spec delay time T lapses after the third reference pulse signal c becomes "1" at time t16 ((c) in FIG. 9).

The register 14c stores the reference delay signal d7 at a falling edge of the third reference pulse signal c. The register 14c stores "0" as a detection signal b3 ((k) in FIG. 9) since the reference delay signal d7 does not yet arrive at the register 14c at time t14 ((g) in FIG. 9).

Similarly, at time t18, the register 14d stores "0" as a detection signal b4 ((l) in FIG. 9).

When the detection signal b1 to b4 are thus determined in the above-mentioned manner, the detection signal b1 to b4 are supplied to the selectors 15i to 15l, respectively.

At time t19, when the mode signal MODE becomes "1" to enter the normal operation mode, the counter 22 is initialized to supply a value "0000". Also, each of the inputs of the selector 15i to 15l is supplied to "1" as the mode signal MODE.

The selector 15i performs AND operation between the detection signal b1 (="1") and an invert (="0") of the detection signal b2 (="1") to output "0" as a selection signal e1. Thus, the output e5 of the NOR gate 19a is "1" ((n) in FIG. 9).

The selector 15j performs AND operation between the detection signal b2 (="1") and an invert (="1") of the detection signal b3 (="0") to output "1" as a selection signal e2. Thus, the output e6 of the NOR gate 19b is "1" ((n) in FIG. 9).

The selector 15k performs AND operation between the detection signal b3 (="0") and an invert (="1") of the detection signal b4 (="0") to output "0" as a selection signal e3. Thus, the output e7 of the NOR gate 19c is "1" ((n) in FIG. 9).

The selector 15l outputs "0" as a selection signal e4 since the detection signal b4 (="0") is supplied. Thus, the output e8 of the NOR gate 19d is "1" ((n) in FIG. 9).

The setting switch 16b is turned on and the setting switches 16a, 16c, and 16d are turned off, since the setting switches 16a, 16b, 16c, and 16d receives the selection signal e1 (="1"), e2 (="0"), e3 (="1"), and e4 (="1") respectively. As a result, the setting switch 16b is set to select the reference delay signal d2 which has passed through the delay circuit 11a.

Consequently, it can be seen that the signal which has a delay time shorter than and closest to the spec delay time T is decided as the reference delay signal d2.

When the mode signal MODE turns to "1" at time t19 ((a) in FIG. 9), the mode changeover switch 23 is switched to the normal operation mode. That is, A first mode changeover switch connects a data input terminal of the flip flop 13 to an output SG of an internal circuit (not shown) of a semiconductor device. A second mode changeover switch connects a clock input terminal of the flip flop 13 to an output ICK of an internal clock generation circuit (not shown) of a semiconductor device.

When the output SG of the internal circuit is supplied to the flip flop 13 and the internal clock ICK rises, the flip flop 13 holds the output SG of the internal circuit. The output SG is delayed by a delay time (Ta+Tb) at the delay circuit 11a, and is supplied as an output delay signal to output terminal 18 through the setting switch 16b which turns on and the inverter 17. As a result, it is possible to provide a delay time of the output signal supplied to the output terminal 18 which does not exceed the spec delay time T.

As described above, the delay time can be set to the desired value by generating the reference delay signal by the delay generation circuit 30 on the basis of the first through the fourth reference delay signals c, by measuring the delay times before and after the reference delay signal passes through the delay circuits in consideration of a delay time α caused by the buffer 17 or the load capacity CAP, and by outputting one of the signals appearing before the signal passes through the delay circuit and after the signal passes through the delay circuits. Therefore, the external load capacity CAP added to the output terminal 18 can be reflected on the output delay signal supplied to the output terminal 18.

Thus, the semiconductor device according to the invention detects the delay time of the reference delay signal which is generated based on the reference pulse signals c and which is calculated before the signal passes through the delay circuit and after the signal passes through delay circuits and outputs one of the signals as reference delay signal.

Therefore, it is possible to set an appropriate delay value for the semiconductor device in consideration of the environment of practical use without measuring the delay value by using an expensive tester. Thereby, timing of output is not changed according to the operation temperature or the operation voltage. Also, after the semiconductor device implemented to a device, it is possible to amend the delay value by adding an external load capacity according to lines or load. Therefore, even if a variation of fabrication of the semiconductor device becomes serious, a desired delay time can be supplied. Also, it is unnecessary to design the semiconductor device in consideration of the unevenness of fabrication, operation temperature, operation voltage, and capacity outside of the semiconductor device.

Also, it is possible to reduce the cost price since a range of allowance of transistor characteristics is widened and a yield of fabrication is improved. Further, it is easy to select a delay time and to deal with any delay spec since a reference pulse for adjusting a delay time is generated by a reference pulse generator. It is also unnecessary to use a precise and expensive tester for checking timing since the verification of the timing may be tolerable.

Further, both the maximum delay and the minimum delay may not be adjusted to satisfy the spec on all conditions in design because it is possible to adjust the delay value by gradually increasing the delay value of the reference delay signal in reset period. Therefore, in design, it should be only noted that the minimum spec of the delay time of the output delay signal is satisfied. Also, a delay value adjusted in the reset period can satisfy a spec regardless of the external load when the semiconductor device is implemented since the adjustment includes an influence of the external load connected to the output terminal.

According to the invention, it is easy to design an output delay which is naturally expected to be more complicated in the future under circumstances where a cycle of a bus clock becomes nearly equal to the difference between the maximum delay time and the minimum delay time because of a high-speed external bus and where it is not possible to satisfy all the condition using a fixed delay circuit. That is, it is possible to enhance a spec including operation temperature without reduction of the yield of fabrication since it is possible to enlarge the difference between the maximum and the minimum of the delay time.

In the first to the third embodiments of the invention, the embodiments including the three delay circuits and the four registers are illustrated. However, the number of the delay circuits and the registers may be changed. Also, each of the setting switches or the sampling switches consists of 5 transistor, but a transfer gate or a logic gate may be used.

As described above, according to the invention, a reference pulse generation unit generates a signal which has a desired delay time represented by an interval between a first timing and a second timing, a delay determination unit compares a reference delay signal which is generated based on the first timing and passes through a delay circuit with the second timing. The delay setting unit outputs one of the reference delay signals supplied from the delay circuit based on the determination result. Therefore, it is possible to set an appropriate delay value for the semiconductor device according to real using circumstance without measuring the delay value using an expensive tester. Furthermore, in reset period, it is possible to adjust the delay value by gradually increasing the delay value of the reference delay signal, and in design phase, it should be only noted that the minimum spec of the delay time of the output delay signal is satisfied.

What is claimed is:

1. A semiconductor device for use in changing a delay time by selecting one of a plurality of reference delays signals which are generated from points of connections of a plurality of delay circuits connected in series to one another, comprising:
   reference pulse generating means for generating, at different times through an output port, a sequence of signals including first and second signals each of which has a first edge at a first timing and a second edge at a second timing, with a time interval which is left between the first and the second edges and which is equal to a predetermined delay time;
   delay determining means for receiving the second signal and the plurality of the reference delay signals produced by allowing the first signal to pass through the delay circuits, the number of the delay circuits which the first signal passes through being different for each reference delay signal, and for determining, at the second timing of the second signal, which of the reference delay signals has a closest receive timing as compared to a timing corresponding to the second timing of the second signal; and
   delay setting means for selecting one of the reference delay signals on the basis of the results of determination in the delay determining means to determine the delay time with reference to the selected one of the reference delay signals,
   wherein the reference pulse generating means includes:
      an oscillator which generates a clock signal;
      a counter which counts the clock signal; and
      a comparator which detects whether or not a value of the counter becomes equal to a predetermined value to produce a detection signal when coincidence is detected between the value of the counter and the predetermined value,
   wherein the reference pulse generation means includes a set-reset flip flop which provides the first timing of the first signal by being set when delay setting operation is started and which provides the second timing of the second signal by being reset in response to the detection signal sent from the comparator.

2. A semiconductor device for use in changing a delay time by selecting one of a plurality of reference delays signals which are generated from points of connections of a plurality of delay circuits connected in series to one another, comprising:
   reference pulse generating means for generating, at different times through an output port, a sequence of signals including first and second signals each of which has a first edge at a first timing and a second edge at a second timing, with a time interval which is left between the first and the second edges and which is equal to a predetermined delay time;
   delay determining means for receiving the second signal and the plurality of the reference delay signals produced by allowing the first signal to pass through the delay circuits, the number of the delay circuits which the first signal passes through being different for each reference delay signal, and for determining, at the second timing of the second signal, which of the reference delay signals has a closest receive timing as compared to a timing corresponding to the second timing of the second signal; and
   delay setting means for selecting one of the reference delay signals on the basis of the results of determination in the delay determining means to determine the delay time with reference to the selected one of the reference delay signals,
   wherein the reference pulse generation means includes:
      a counter which is reset by a signal for starting a delay setting operation;
      a first comparator which detects whether or not a value of the counter becomes equal to a first value, and which produces a coincident signal at a first timing on coincidence between the value of the counter and the first value; and
      a second comparator which detects whether or not the value of the counter becomes equal to a second value, and which produces a coincident signal at a second timing on coincidence between the value of the counter and the second value.

3. A semiconductor device for use in changing a delay time by selecting one of a plurality of reference delays signals which are generated from points of connections of a plurality of delay circuits connected in series to one another, comprising:
   reference pulse generating means for generating, at different times through an output port, a sequence of signals including first and second signals each of which has a first edge at a first timing and a second edge at a second timing, with a time interval which is left between the first and the second edges and which is equal to a predetermined delay time;
   delay determining means for receiving the second signal and the plurality of the reference delay signals produced by allowing the first signal to pass through the delay circuits, the number of the delay circuits which the first signal passes through being different for each reference delay signal, and for determining, at the second timing of the second signal, which of the reference delay signals has a closest receive timing as compared to a timing corresponding to the second timing of the second signal; and
   delay setting means for selecting one of the reference delay signals on the basis of the results of determination in the delay determining means to determine the delay time with reference to the selected one of the reference delay signals, wherein the delay setting means includes:
  delay detecting means for detecting one of the plurality of reference delay signals which is closest in time to the predetermined delay time; and
  a setting switch for setting one of the plurality of the reference delay signals based on an output of the delay detecting means.

4. A semiconductor device as claimed in claim 3, wherein the delay detecting means selects the reference delay signal which is closest to the predetermined delay time and which does not exceed the predetermined delay time.

5. A semiconductor device as claimed in claim 4, wherein the delay detecting means includes:
  first setting means responsive to the reference delay signal for producing a first logic level of signal;
  second setting means responsive to the reference delay signal for producing a second logic level of signal; and
  an AND circuit which performs AND operation between an output of the first setting means and an inverse of an output of the second setting means.

6. A semiconductor device as claimed in claim 3, wherein the delay detecting means selects one of the reference delay signals which is closest in time to the predetermined delay time and which exceeds the predetermined delay time.

7. A semiconductor device as claimed in claim 6, wherein the delay detecting means includes:
  first setting means responsive to the reference delay signal for producing a first logic level of signal;
  second setting means responsive to the reference delay signal for producing a second logic level of signal; and
  an AND circuit which performs AND operation between an inverse of an output of the first setting means and an output of the second setting means.

8. A semiconductor device as claimed in claim 1, wherein the delay determining means compares corresponding pairs of the reference delay signals with each other, with each of the corresponding pairs being provided from an adjacent two of the plurality of delay circuits that are connected in series.

9. A semiconductor device comprising:
  a mode changeover switch which selects a normal operation mode or a setup operation mode;
  a delay unit adapted to include a plurality of delay circuits each of which is connected in series to one another and which successively supplies a delayed signal from each output of the delay circuits when a signal is entered into one end of the delay circuits;
  a reference pulse generator which generates a reference signal which is changed for a time interval defined by a first timing and a second timing when the mode changeover switch selects the setup operation mode, the time interval between the first timing and the second timing being equal to a predetermined delay time;
  a delay determining unit which receives the delayed signals form the plurality of delay circuits at the second timing after a signal which is generated based on the reference signal is entered into the one end of the delay circuits, the delay determining unit producing a determining result from the delayed signals; and
  a delay setting unit which supplies a signal which is delayed from the reference signal with reference to the predetermined delay time by selecting one of the delayed signals from the plurality of delay circuits on the basis of the determining result of the delay determining unit.

10. A semiconductor device as claimed in claim 9, wherein the reference pulse generator comprises:
  an oscillator which generates a clock signal;
  a counter which counts the clock signal; and
  a comparator which detects whether or not a value of the counter becomes a predetermined value to produce a detection signal when coincidence is detected between the value of the counter and the predetermined value.

11. A semiconductor device as claimed in claim 10, wherein the reference pulse generator includes a set-reset flip flop which changes the reference signal at the first timing by being set in response to selecting of the setup operation mode by the mode changeover switch and which changes the reference signal at the second timing by being reset in response to the detection signal sent from the comparator.

12. A semiconductor as claimed in claim 9, wherein the reference pulse generator comprises:
  a counter which is reset in response to selecting of the setup operation mode by the mode changeover switch;
  a first comparator which detects whether or not a value of the counter becomes equal to a first value, and which produces a first coincident signal at the first timing; and;
  a second comparator which detects whether or not a value of the counter becomes equal to a second value, and which produces a second coincident signal at the second timing.

13. A semiconductor device as claimed in claim 9, wherein the delay determining unit includes a plurality of data holding units each of which receives one of the delayed signals and holds the signal at the second timing.

14. A semiconductor device as claimed in claim 13, wherein the data holding unit includes a flip flop.

15. A semiconductor device as claimed in claim 9, wherein the delay setting unit includes:
  a delay detecting unit which detects a signal, from the delayed signals, which has a delay time which is equal to or closest to the predetermined delay time; and
  a setting switch which selects the signal detected by the delay detecting unit and supplies the signal.

16. A semiconductor device as claimed in claim 15, wherein the delay detecting unit detects a signal having a delay time which is closest to the predetermined delay time and does not exceed the predetermined delay time.

17. A semiconductor device as claimed in claim 16, wherein the delay determining unit includes a plurality of setting units each of which receives an output signal of one of the delay circuits, and which produces a first logic level of signal when the output signal is changed between the first timing and the second timing, and produces a second logic level of signal when the output signal is changed between the first timing and the second timing, and
  the delay detecting unit includes AND circuits each of which performs AND operation between a signal produced by first setting unit and a signal produced by a second setting unit which corresponds to a delay circuit adjacent to a delay circuit of the first setting unit.

18. A semiconductor device as claimed in claim 15, wherein the delay detecting unit detects a signal having a delay time which is closest to the predetermined delay time and exceeds the predetermined delay time.

19. A semiconductor device as claimed in claim 16, wherein the delay determining unit includes a plurality of setting units each of which receives an output signal of one of the delay circuits, and which produces a first logic level signal when the output signal is changed between the first timing and the second timing, and produces a second logic level signal when the output signal is changed between the first timing and the second timing, and the delay detecting unit includes AND circuits each of which performs AND operation between a signal produced by a first setting unit and a signal produced by a second setting unit which corresponds to a delay circuit adjacent to a delay circuit of the first setting unit.

20. A semiconductor device comprising:

a mode changeover switch which selects a normal operation mode or a setup operation mode;

a delay unit adapted to include a plurality of delay circuits each of which is connected in series to one another and which successively supplies a delayed signal from each output of the delay circuits when a signal is entered into one end of the delay circuits;

a delay setting unit which supplies from an output terminal a signal one after another by sequentially selecting one of the delayed signals from the plurality of delay circuits when the mode changeover switch selects the setup operation mode;

a reference pulse generator which generates a reference signal which is changed for a time interval defined by first timing and second timing when the mode changeover switch selects the setup operation mode, the time interval between the first timing and the second being equal to a predetermined delay time; and a delay determining unit which receives the delayed signals supplied from the output terminal at the second timing after a signal which is generated based on the reference signal is entered into the one end of the delay circuits, the delay determining unit producing a determining result from the delayed signals, wherein the delay setting unit supplies a signal which is delayed from the reference signal with reference to the predetermined delay time by selecting one of the delayed signals from the plurality of delay circuits on the basis of the determining result of the delay determining unit when the mode changeover switch selects the normal operation mode.

21. A semiconductor device as claimed in 20, wherein the reference pulse generator generates a plurality of reference signals, the number of the reference signals being the same as the number of the outputs of the delay circuits.

22. A semiconductor device as claimed in claim 21, wherein the delay determining unit comprises:

a counter which counts an output pulse of the reference pulse generator;

a setting switch which selects one of the delayed signals based on a count value of the counter and which connects the selected signal to the output terminal;

a sampling switch which selects a determination according to the count value of the counter; and a data holding unit which holds output data from the sampling switch at the second timing.

* * * * *